United States Patent
Yoshihara et al.

(10) Patent No.: US 8,216,389 B2
(45) Date of Patent: Jul. 10, 2012

(54) SUBSTRATE CLEANING METHOD AND SUBSTRATE CLEANING APPARATUS

(75) Inventors: Kousuke Yoshihara, Koshi (JP); Yuichi Yoshida, Koshi (JP); Taro Yamamoto, Koshi (JP)

(73) Assignee: Tokyo Electron Limited, Tokyo-To (JP)

( * ) Notice: Subject to any disclaimer, the term of this patent is extended or adjusted under 35 U.S.C. 154(b) by 511 days.

(21) Appl. No.: 12/400,419

(22) Filed: Mar. 9, 2009

(65) Prior Publication Data

US 2009/0250079 A1 Oct. 8, 2009

(30) Foreign Application Priority Data

Apr. 3, 2008 (JP) ................... 2008-096725

(51) Int. Cl.
  *B08B 7/00* (2006.01)
  *B08B 3/02* (2006.01)
(52) U.S. Cl. ............... 134/33; 134/36; 134/37; 134/18
(58) Field of Classification Search .......... 134/33, 134/34, 144, 149, 172
  See application file for complete search history.

(56) References Cited

U.S. PATENT DOCUMENTS

| | | |
|---|---|---|
| 2006/0048792 A1 | 3/2006 | Nakamura et al. |
| 2007/0044823 A1 * | 3/2007 | Yamamoto et al. ............ 134/33 |
| 2007/0131256 A1 | 6/2007 | Nanba et al. |
| 2007/0137672 A1 * | 6/2007 | Sasaki et al. .................... 134/2 |

FOREIGN PATENT DOCUMENTS

| | | |
|---|---|---|
| JP | 2001-53051 | 2/2001 |
| JP | 2003-31545 | 1/2003 |
| JP | 2006-80315 | 3/2006 |
| JP | 2006-114884 A | 4/2006 |
| JP | 2008-060103 A | 3/2008 |
| WO | WO 2005/050724 | 6/2005 |

OTHER PUBLICATIONS

Office Action issued Jan. 31, 2012, in Japanese Patent Application No. 2008-096725, filed Apr. 3, 2008 (with English translataion).

* cited by examiner

*Primary Examiner* — Michael Barr
*Assistant Examiner* — Caitlin N Dunlap
(74) *Attorney, Agent, or Firm* — Oblon, Spivak, McClelland, Maier & Neustadt, L.L.P.

(57) ABSTRACT

A substrate cleaning method that includes: a step in which, while a substrate holder is being continuously rotated, a to-be-discharged position of the cleaning liquid on the substrate is changed to an eccentric position deviated from the central part of the substrate, and a gas is discharged from a gas nozzle to the central part of the substrate so as to form a dried area of the cleaning liquid under a condition in which a shortest distance between an edge of a cleaning liquid flow output from the cleaning-liquid nozzle and an edge of a gas flow output from the gas nozzle is set between 9 mm and 15 mm.

5 Claims, 27 Drawing Sheets

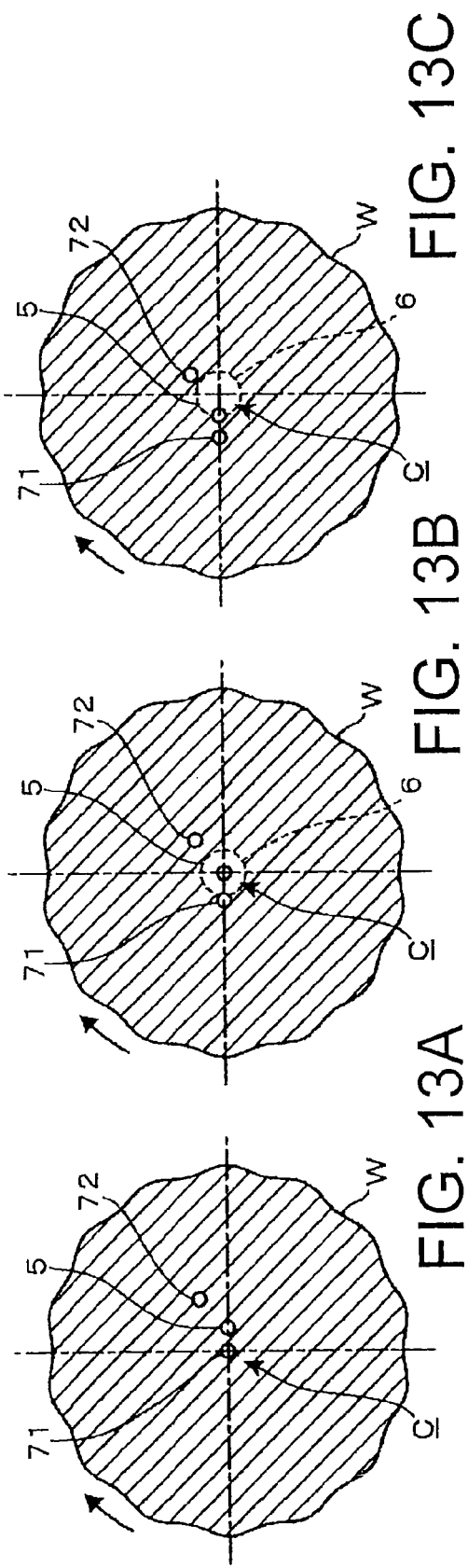

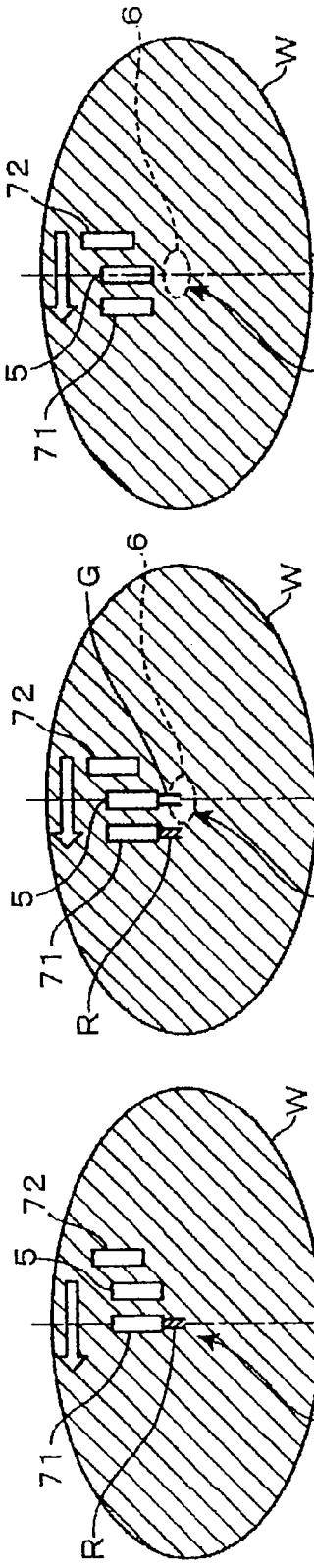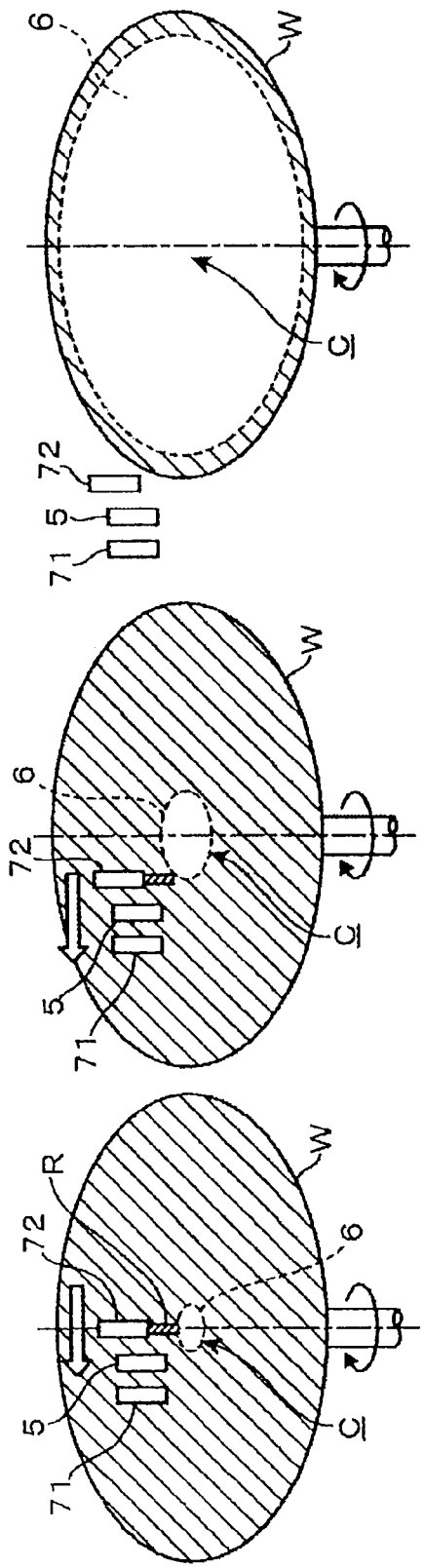

SUBSTRATE CLEANING METHOD AND SUBSTRATE CLEANING APPARATUS

FIELD OF THE INVENTION

The present invention relates to a substrate cleaning method and a substrate cleaning apparatus, for cleaning a substrate whose surface is hydrophobic, such as a substrate onto which a resist used for an immersion exposure process has been applied, and a substrate that has been further developed after an immersion exposure process.

BACKGROUND ART

In a photoresist step as one of semiconductor manufacturing steps, a resist is conventionally applied to a surface of a semiconductor wafer (hereinafter referred to as "wafer") which is a substrate, and the wafer is developed after an exposure process so as to form a resist pattern in the surface. Such a series of processes is generally performed by a system in which an exposure apparatus is connected to an application and development apparatus configured to apply and develop a resist.

In the developing process in the series of processes, a developer is supplied onto a wafer, and then the wafer is kept in a stationary state for a predetermined period, for example, so that a soluble region of the resist is dissolved to form a pattern. Thereafter, a cleaning process is performed for removing the dissolved matters of the resist together with the developer from a surface of the wafer. As a conventional cleaning method, a cleaning liquid is supplied to a central part of the wafer, a film of the cleaning liquid is spread by a centrifugal force, and the dissolved matters and the developer are removed from the wafer by means of the liquid-film flow.

However, there is a possibility that the dissolved matters (dissolved products) cannot be fully eliminated by the spin cleaning method. When a line width of the pattern is wide, the spin cleaning method poses no problem. However, when a line width thereof is narrow, it is highly possible that some remaining dissolved products may appear (remain) as development faults. Thus, in the present circumstances, the spin cleaning is performed for as long as 60 seconds, for example. However, even when the spin-cleaning process is performed for such a long time, some dissolved products may be left, i.e., a desired perfect cleaning may not be performed.

Thus, the Applicant of this patent application has proposed a method in which a cleaning liquid is discharged from a cleaning-liquid nozzle to a central part of a wafer that is being rotated, the cleaning-liquid nozzle is then slightly moved outward the wafer, an $N_2$ gas is discharged from a gas nozzle to the central part of the wafer so as to form a core of a dried area, and then the cleaning-liquid nozzle is moved further outward the wafer while discharging the cleaning liquid such that the cleaning-liquid nozzle is not caught up with the spreading dried area (JP2006-80315A (particularly FIG. 7, and paragraphs 0040 and 0043) (Patent Document 1)). This method is advantageous in that a high cleaning effect can be obtained, and the cleaning process can be performed for a shorter period.

On the other hand, since a device pattern has been more and more miniaturized and also a film has been more and more thinned, a resolution of exposure is required to be raised. Thus, in order to further improve an exposure technique using an existing light source, such as argon fluoride (ArF) and krypton fluoride (KrF), so as to raise the resolution, it is under review that a substrate is exposed with a light-transmittable liquid phase being formed on a surface of the substrate (this method is hereinafter referred to as "immersion exposure process"). The immersion exposure process, in which a light is transmitted through extrapure water, for example, takes advantage of the fact that a wavelength becomes shorter in the water, e.g., a 193-nm wavelength of the ArF becomes substantially a 134-nm wavelength in the water.

One of problems of this immersion exposure process is that there is a possibility that a wafer on which water droplets remain may be transferred from an exposure apparatus to an application and development apparatus. An exposed wafer is subjected to a thermal process. In this case, presence of the water droplets on the wafer, or presence of so-called water marks, which are water stains generated by the dried water droplets, may adversely affect the resolution of a pattern directly below the water droplets or the water marks. Thus, it is necessary to clean the surface of the exposed wafer so as to remove the water droplets.

In the immersion exposure process, in order to improve a scanning and tracking property of an immersion part (tip end of the lens) of an exposure apparatus so as to secure a throughput equivalent to that of a conventional exposure apparatus, it is under review that there is formed on the exposed wafer surface a highly water-repellent protective film whose static contact angle with respect to water is between, e.g., about 75 and 85 degrees. However, it is all the more likely that small water droplets remain on a surface of the protective film because of the high water repellency of the protective film. The static contact angle with respect to water is defined as follows. As shown in FIG. 25, when a water droplet adhering to a surface of a substrate is viewed in its cross-section, an outer edge of the water droplet is viewed as an arc. The static contact angle with respect to water is an angle $\theta$ which is defined between a tangent of the arc on the surface of the substrate and the surface itself. The static contact angle with respect to water may be lowered by a developing process. Herebelow, the simple term "contact angle" means the static contact angle, and more specifically the term means a static contact angle with respect to water before a substrate is subjected to a developing process.

In a scanning process by the immersion part, when particles remain on the surface of the substrate, the particles may be taken into a liquid existing under the immersion part, resulting in development faults. That is, development faults may be caused by the particles in respective scanning positions. Thus, before the immersion exposure step, it is necessary to clean the wafer surface so as to perfectly remove the particles. However, in the method of the Patent Document 1, since a contact angle of the surface with respect to the wafer is large, i.e., the surface has a high water repellency, it is difficult to fully remove the particles (before the immersion exposure process) or water droplets (after the immersion exposure process) in an area remote from a central part of the wafer.

The reason therefor is described with reference to FIG. 26A and FIG. 26B. As shown in FIG. 26A, a cleaning liquid R is firstly discharged from a cleaning-liquid nozzle 11 to a center of a wafer W and the cleaning liquid R is spread all over the surface of the wafer W. Then, as shown in FIG. 26B, an $N_2$ gas is discharged from a gas nozzle 12 to form a core of a dried area on the central part of the wafer W. At this time, since the water repellency of the surface of the wafer W is high, a thin liquid film moves outward at a considerably high speed. Thus, the thin liquid film is torn into water droplets M which then may remain on the surface. In an area near to the center of the wafer W, since the cleaning liquid R is discharged to the central part of the wafer W, and a centrifugal force in this area is smaller, a cleaning efficiency is high in this area, whereby substantially no water droplet remains in this area.

In addition, it is under review that a more water-repellent (more hydrophobic) resist film (whose static contact angle with respect to water is 85 degrees or more) is used instead of the protective film. When such a resist is used, the water repellency of the surface of the wafer is still high even after a development process. This gives rise to the following problem in the method of the Patent Document 1.

In a case in which a water repellency of the surface of the wafer is not so high, i.e., a contact angle with respect to water is not so large, when the dried core is formed and spread after the cleaning liquid has been discharged to the central part of the wafer and spread all over the surface of the wafer, as shown in FIG. 27A, the cleaning liquid R remaining in a recess 13 of the resist pattern is taken by the cleaning liquid moving outward the wafer along the patterned surface outside the recess 13, so that the cleaning liquid is discharged from the recess 13. On the other hand, in a case in which a contact angle with respect to water on the surface of the wafer is as large as 85 degrees, the speed at which the dried core is spread becomes considerably fast, namely, the speed at which the thin liquid film on the patterned surface moves outward the wafer becomes considerably fast. Thus, as shown in FIG. 27B, the cleaning liquid R in the recess 13 is torn from the liquid film and is left in the recess 13. Since this cleaning liquid R contains dissolved products of the resist, the cleaning liquid R causes a development fault. Although this development fault scarcely occurs in an area near to the center of the wafer, which is described above, the number of development faults noticeably increases in an area outside the area that is near to the center of the wafer.

Further, WO2005-50724 (particularly, FIG. 7, and paragraphs 0040 and 0043) (patent document 2) describes a cleaning method in which a process-liquid nozzle is moved at a high speed from a center of a wafer to a position distant therefrom by 10 mm to 15 mm, an $N_2$ gas is promptly ejected from an $N_2$ nozzle to the central part of the wafer so as to facilitate drying of the central part of the wafer, and the process-liquid nozzle is caused to scan toward a periphery of the wafer at a speed of 3 mm/second or less. However, the Patent Document 2 does not describe a technique for reliably cleaning the overall surface of the wafer, i.e., from an area near to the central part of the wafer to a periphery thereof, when the surface of the wafer has a contact angle of as large as 85 degrees or more. Specifically, there may arise problems in that the dried area may not be suitably formed depending on sizes of the cleaning-liquid nozzle and the gas nozzle and/or in that the nozzle-movement speed is so slow that the process period is long.

SUMMARY OF THE INVENTION

The present invention has been made in view of the above circumstances. The object of the present invention is to provide a technique for producing a high cleaning effect and performing a cleaning process for a short period, even for a water-repellent material whose static contact angle with respect to water on a surface thereof is 85 degrees or more.

A substrate cleaning method according to the present invention is a substrate cleaning method for cleaning a surface of a substrate whose static contact angle with respect to water is 85 degrees or more, the substrate cleaning method comprising: a step in which the substrate is held horizontally by a substrate holder in such a manner that a central part of the substrate and a central part in rotation correspond to each other; a step in which, while the substrate holder is being rotated about a vertical axis, a cleaning liquid is discharged from a cleaning-liquid nozzle to the central part of the substrate and is spread over all the surface of the substrate by a centrifugal force; a step in which, while the substrate holder is being continuously rotated, a to-be-discharged position of the cleaning liquid on the substrate is changed to an eccentric position deviated from the central part of the substrate, and a gas is discharged from a gas nozzle to the central part of the substrate so as to form a dried area of the cleaning liquid under a condition in which a distance between an interface on a side of a to-be-discharged position of the gas in the to-be-discharged position of the cleaning liquid and an interface on a side of the to-be-discharged position of the cleaning liquid in the to-be-discharged position of the gas is set between 9 mm and 15 mm; and a step in which, while the substrate holder is being continuously rotated, the to-be-discharged position of the cleaning liquid is moved toward a periphery of the substrate at a speed lower than a speed at which the dried area is spread outward.

In the present invention, when a highly water-repellent surface of a substrate whose contact angle with respect to water is 85 degrees or more is spin-cleaned, the spin-cleaning process is performed as follows. After a cleaning liquid has been supplied to a central part of the substrate, the to-be-supplied position of the cleaning liquid on the substrate is changed to an eccentric position deviated from the central part of the substrate, and a gas is supplied to the central part of the substrate to thereby generate a dried area of the cleaning liquid, under a condition in which a distance between an interface on a side of a to-be-discharged position of the gas in the to-be-discharged position of the cleaning liquid and an interface on a side of the to-be-discharged position of the cleaning liquid in the to-be-discharged position of the gas is set between 9 mm and 15 mm. Thereafter, while the substrate is being rotated, the to-be-supplied position of the cleaning liquid is moved toward a periphery of the substrate at a speed lower than a speed at which the dried area is spread outward. Therefore, a high cleaning effect can be produced, and the cleaning process can be performed for a short period. In particular, as apparent from below evaluation tests, when the present invention is applied to a substrate that has been developed by supplying a developer on an exposed surface of the substrate, the number of development faults can be decreased to nearly zero, whereby yield rate can be significantly improved.

In addition, it is possible to restrain liquid droplets, which are generated from a process atmosphere and adhere to the nozzle, from falling down to the formed dried area, whereby the number of development faults can be more reliably decreased.

For example, the cleaning-liquid nozzle and the gas nozzle are integrally moved by a common drive mechanism, and the to-be-discharged position of the cleaning liquid on the substrate is changed to the eccentric position deviated from the central part of the substrate, by moving the cleaning-liquid nozzle.

A substrate cleaning method according to another invention is a substrate cleaning method for cleaning a surface of a substrate whose static contact angle with respect to water is 85 degrees or more, with the use of a first cleaning-liquid nozzle, a second cleaning-liquid nozzle, and a gas nozzle, which are integrally moved by a common drive mechanism via a nozzle holder, the substrate cleaning method comprising: a step in which the substrate is held horizontally by a substrate holder in such a manner that a central part of the substrate and a central part in rotation correspond to each other; a step in which, while the substrate holder is being rotated about a vertical axis, a cleaning liquid is discharged from the first cleaning-liquid nozzle to the central part of the substrate and is spread over all the surface of the substrate by a centrifugal force; a step in which, while the substrate holder is being continuously rotated, the nozzle holder is moved in such a manner that the cleaning liquid from the first cleaning-liquid nozzle is discharged to an eccentric position deviated from the central part of the substrate and that a gas is discharged from the gas nozzle to the central part of the substrate so as to form a dried area of the cleaning liquid under a condition in which a distance between an interface on a side of a to-be-discharged position of the gas in a to-be-discharged position of the cleaning liquid and an interface on a side of the to-be-discharged position of the cleaning liquid in the to-be-discharged position of the gas is set between 9 mm and 15 mm; a step in which, the nozzle holder is moved so as to move the first cleaning-liquid nozzle away from the central part of the substrate, and the cleaning liquid starts to be discharged from the second cleaning-liquid nozzle under a condition in which the gas is stopped to be discharged, and a distance between the central part of the substrate and the to-be-discharged position of the cleaning liquid from the second cleaning-liquid nozzle is shorter than a distance between the central part of the substrate and a projection position of the gas nozzle onto the substrate; and a step in which, while the substrate holder is being continuously rotated, the to-be-discharged position of the cleaning liquid from the second cleaning-liquid nozzle is moved toward a periphery of the substrate at a speed lower than a speed at which the dried area is spread outward, with the cleaning liquid being discharged from the second cleaning-liquid nozzle.

For example, while the to-be-discharged position of the cleaning liquid from the second cleaning-liquid nozzle is moved toward the periphery of the substrate, the cleaning liquid from the first cleaning-liquid nozzle is stopped being discharged.

A substrate cleaning method according to still another invention is a substrate cleaning method for cleaning a surface of a substrate whose static contact angle with respect to water is 85 degrees or more, with the use of a cleaning-liquid nozzle and a gas nozzle, which are integrally moved by a common drive mechanism through a nozzle holder, the substrate cleaning method comprising: a step in which the substrate is held horizontally by a substrate holder in such a manner that a central part of the substrate and a central part in rotation correspond to each other; a step in which, while the substrate holder is being rotated about a vertical axis, a cleaning liquid is discharged from a cleaning-liquid nozzle to the central part of the substrate and is spread over all the surface of the substrate by a centrifugal force; a step in which, while the substrate holder is being continuously rotated, the nozzle holder is moved in such a manner that the cleaning liquid is discharged to an eccentric position deviated from the central part of the substrate and that a gas is discharged from the gas nozzle to the central part of the substrate so as to form a dried area of the cleaning liquid under a condition in which a distance between an interface on a side of a to-be-discharged position of the gas in a to-be-discharged position of the cleaning liquid and an interface on a side of the to-be-discharged position of the cleaning liquid in the to-be-discharged position of the gas is set between 9 mm and 15 mm; a step in which, the cleaning liquid and the gas are stopped being discharged, the nozzle holder is moved in a direction opposite to the direction in which the nozzle holder has been moved to form the dried area, and the cleaning liquid is restarted to be discharged at an outer edge position of the dried area; and a step in which, while the substrate holder is being continuously rotated, the to-be-discharged position of the cleaning liquid is moved toward a periphery of the substrate at a speed lower than a speed at which the dried area is spread outward, with the cleaning liquid being discharged.

Herein, the "outer edge position of the dried area" includes positions inside and outside the outer edge position by several millimeters such as 2 millimeters, as long as they do not affect the cleaning effect. For example, the to-be-discharged position of the cleaning liquid may be slightly deviated from the outer edge position of the dried area based on a timing of the operation of the nozzle driving mechanism and a timing of the spreading of the dried area.

In the aforementioned substrate cleaning method, the cleaning-liquid nozzle is configured to discharge the cleaning liquid in an inclined direction, and when the gas nozzle is moved from the central part of the substrate to the periphery thereof, a projection area of the cleaning-liquid nozzle onto the surface of the substrate in a discharge direction thereof is not positioned within the dried area. Alternatively, the cleaning-liquid nozzle is disposed on the nozzle holder in such a manner that an orientation of the cleaning-liquid nozzle can be changed, and when the gas nozzle is moved from the central part of the substrate to the periphery thereof, the orientation of the cleaning-liquid nozzle is adjusted in such a manner that a projection area of the cleaning-liquid nozzle onto the surface of the substrate in a discharge direction thereof is not positioned within the dried area.

In these substrate cleaning method, for example, after the dried area has been generated, a rotation number of the substrate is decreased more as the to-be-discharged position of the cleaning liquid comes closer to the periphery of the substrate. In this case, preferably, the rotation number of the substrate is controlled in such a manner that the centrifugal force at the to-be-discharged position of the cleaning liquid is calculationally constant. In addition, for example, the substrate is an exposed substrate that has been developed by discharging a developer onto a surface of the exposed substrate. In this case, for example, the surface of the substrate includes a surface of a resist. In addition, for example, the substrate is a substrate that has been subjected to a resist application process but is not yet subjected to an immersion exposure process, or a substrate that has been subjected to an immersion exposure process but is not yet subjected to a developing process.

A substrate cleaning apparatus according to the present invention is a substrate cleaning apparatus for cleaning a surface of a substrate, the surface being a hydrophobic surface whose static contact angle with respect to water is 85 degrees or more, the substrate cleaning apparatus comprising: a substrate holder configured to hold the substrate horizontally in such a manner that a central part of the substrate and a central part in rotation correspond to each other; a rotation mechanism configured to rotate the substrate holder about a vertical axis; a cleaning-liquid nozzle configured to discharge a cleaning liquid to the surface of the substrate held by the substrate holder; a gas nozzle configured to discharge a gas to the surface of the substrate held by the substrate holder; a nozzle drive mechanism configured to move the cleaning-liquid nozzle and the gas nozzle respectively; and a control part configured to output control signals so as to perform: a step in which, while the substrate holder is being rotated, the cleaning liquid is discharged from the cleaning-liquid nozzle to the central part of the substrate and is spread over all the surface of the substrate by a centrifugal force; a step in which, while the substrate holder is being continuously rotated, a to-be-discharged position of the cleaning liquid on the substrate is changed to an eccentric position deviated from the central part of the substrate, and the gas is discharged from the gas nozzle to the central part of the substrate so as to form a dried area of the cleaning liquid under a condition in which a distance between an interface on a side of a to-be-discharged position of the gas in the to-be-discharged position of the cleaning liquid and an interface on a side of the to-be-discharged position of the cleaning liquid in the to-be-discharged position of the gas is set between 9 mm and 15 mm; and a step in which, while the substrate holder is being continuously rotated, the cleaning-liquid nozzle that has been discharging the cleaning liquid to the eccentric position is further moved toward a periphery of the substrate at a speed lower than a speed at which the dried area is spread outward.

For example, the nozzle drive mechanism is common to the cleaning-liquid nozzle and the gas nozzle so as to integrally move the cleaning-liquid nozzle and the gas nozzle, and the cleaning-liquid nozzle and the gas nozzle are arranged in such a manner that the distance between the interface on the side of the to-be-discharged position of the gas in the to-be-discharged position of the cleaning liquid and the interface on the side of the to-be-discharged position of the cleaning liquid in the to-be-discharged position of the gas is set between 9 mm and 15 mm.

A substrate cleaning apparatus according to another invention is a substrate cleaning apparatus for cleaning a surface of a substrate, the surface being a hydrophobic surface whose static contact angle with respect to water is 85 degrees or more, the substrate cleaning apparatus comprising: a substrate holder configured to hold the substrate horizontally in such a manner that a central part of the substrate and a central part in rotation correspond to each other; a rotation mechanism configured to rotate the substrate holder about a vertical axis; a first cleaning-liquid nozzle and a second cleaning-liquid nozzle that are configured to discharge a cleaning liquid to the surface of the substrate held by the substrate holder; a gas nozzle configured to discharge a gas to the surface of the substrate held by the holder; a nozzle drive mechanism configured to integrally move the first cleaning-liquid nozzle, the second cleaning-liquid nozzle, and the gas nozzle respectively; and a control part configured to output control signals so as to perform: a step in which, while the substrate holder is being rotated about the vertical axis, the cleaning liquid is discharged from the first cleaning-liquid nozzle to the central part of the substrate and is spread over all the surface of the substrate by a centrifugal force; a step in which, while the substrate holder is being continuously rotated, a nozzle holder is moved in such a manner that the cleaning liquid from the first cleaning-liquid nozzle is discharged to an eccentric position deviated from the central part of the substrate and that the gas is discharged from the gas nozzle to the central part of the substrate so as to form a dried area of the cleaning liquid under a condition in which a distance between an interface on a side of a to-be-discharged position of the gas in a to-be-discharged position of the cleaning liquid and an interface on a side of the to-be-discharged position of the cleaning liquid in the to-be-discharged position of the gas is set between 9 mm and 15 mm; a step in which, the nozzle holder is moved so as to move the first cleaning-liquid nozzle away from the central part of the substrate, the cleaning liquid starts to be discharged from the second cleaning-liquid nozzle under a condition in which the gas is stopped to be discharged, and a distance between the central part of the substrate and the to-be-discharged position of the cleaning liquid from the second cleaning-liquid nozzle is shorter than a distance between the central part of the substrate and a projection position of the gas nozzle onto the substrate; and a step in which, while the substrate holder is being continuously rotated, the to-be-discharged position of the cleaning liquid from the second cleaning-liquid nozzle is moved toward a periphery of the substrate at a speed lower than a speed at which the dried area is spread outward, with the cleaning liquid being discharged from the second cleaning-liquid nozzle.

Herein, the meaning of "the distance between the central part of the substrate and the to-be-discharged position of the cleaning liquid from the second cleaning-liquid nozzle is shorter than the distance between the central part of the substrate and the projection position of the gas nozzle onto the substrate" includes a case in which these distances are the same. Namely, the positions of the second cleaning-liquid nozzle and the gas nozzle are determined in such a manner that liquid droplets falling from the gas nozzle can be removed by the cleaning liquid supplied from the second cleaning-liquid nozzle.

A substrate cleaning apparatus according to still another invention is a substrate cleaning apparatus for cleaning a surface of a substrate, the surface being a hydrophobic surface whose static contact angle with respect to water is 85 degrees or more, the substrate cleaning apparatus comprising: a substrate holder configured to hold the substrate horizontally in such a manner that a central part of the substrate and a central part in rotation correspond to each other; a rotation mechanism configured to rotate the substrate holder about a vertical axis; a cleaning-liquid nozzle configured to discharge a cleaning liquid to the surface of the substrate held by the substrate holder; a gas nozzle configured to discharge a gas to the surface of the substrate held by the substrate holder; a nozzle drive mechanism configured to move the cleaning-liquid nozzle and the gas nozzle respectively; and a control part configured to output control signals so as to perform: a step in which, while the substrate holder is being rotated about the vertical axis, the cleaning liquid is discharged from the cleaning-liquid nozzle to the central part of the substrate and is spread over all the surface of the substrate by a centrifugal force; a step in which, while the substrate holder is being continuously rotated, a nozzle holder is moved in such a manner that the cleaning liquid is discharged to an eccentric position deviated from the central part of the substrate and that a gas is discharged from the gas nozzle to the central part of the substrate so as to form a dried area of the cleaning liquid under a condition in which a distance between an interface on a side of a to-be-discharged position of the gas in a to-be-discharged position of the cleaning liquid and an interface on a side of the to-be-discharged position of the cleaning liquid in to-be-discharged position of the gas is set between 9 mm and 15 mm; a step in which, the cleaning liquid and the gas are stopped being discharged, the nozzle holder is moved in a direction opposite to the direction in which the nozzle holder has been moved to form the dried area, and the cleaning liquid is restarted to be discharged at an outer edge position of the dried area; and a step in which, while the substrate holder is being continuously rotated, the to-be-discharged position of the cleaning liquid is moved toward a periphery of the substrate at a speed lower than a speed at which the dried area is spread outward, with the cleaning liquid being discharged.

In the aforementioned substrate cleaning apparatus, for example, the cleaning-liquid nozzle is configured to discharge the cleaning liquid in an inclined direction in such a manner that, when the gas nozzle is moved from the central part of the substrate to the periphery thereof, a projection area of the cleaning-liquid nozzle onto the surface of the substrate in a discharge direction thereof is not positioned within the dried area. Alternatively, for example, the cleaning-liquid nozzle is disposed on the nozzle holder in such a manner that an orientation of the cleaning-liquid nozzle can be changed, and when the gas nozzle is moved from the central part of the substrate to the periphery thereof, the orientation of the cleaning-liquid nozzle is adjusted in such a manner that a projection area of the cleaning-liquid nozzle onto the surface of the substrate in a discharge direction thereof is not positioned within the dried area. In addition, for example, the control part is adapted to control the rotation mechanism in such a manner that a rotation number of the substrate is decreased as the position of the cleaning-liquid nozzle comes closer to the periphery of the substrate after the cleaning-liquid has discharged the cleaning liquid to the eccentric position. In this case, the control part is adapted to control the rotation number of the substrate in such a manner that the centrifugal force is calculationally constant at each to-be-discharged position of the cleaning liquid, after the cleaning-liquid nozzle has discharged the cleaning liquid to the eccentric position.

When the substrate is cleaned after the substrate has been subjected to a development process, in which a developer has been supplied to the substrate, the condition that a static contact angle with respect to water of the substrate is 85 degrees or more means that a static contact angle with respect to water of the substrate is 85 degrees or more before the substrate is subjected to the development process. From such a reason that conditions of the surface of the resist may be changed by the developer, even when the substrate has the surface whose static contact angle with respect to water is 85 degrees or more before the substrate is subjected to the development process, there is a possibility that the static contact angle with respect to water of the resist might become slightly lower than 85 degrees at the cleaning process. However, since the cleaning process is needed to be performed immediately after the development process, it is difficult to exactly measure the static contact angle between the development process and the cleaning process. Thus, the static contact angle is defined as described above.

A storage medium according to the present invention is a storage medium storing a program that is executable in a computer, the storage medium being used in an apparatus for cleaning a surface of a substrate, the surface being a hydrophobic surface whose static contact angle with respect to water is 85 degrees or more, wherein the program has a group of steps to implement the aforementioned substrate cleaning method.

BRIEF DESCRIPTION OF THE DRAWINGS

FIGS. 13A to 13F are explanatory views showing positions of the nozzles in respective steps during a wafer cleaning process by the substrate cleaning apparatus in the third embodiment.

FIGS. 14A to 14F are explanatory views showing stepwise states in which a developed wafer is cleaned by using the substrate cleaning apparatus in the third embodiment.

BEST MODE FOR CARRYING OUT THE INVENTION

[First Embodiment]

Figure 1:
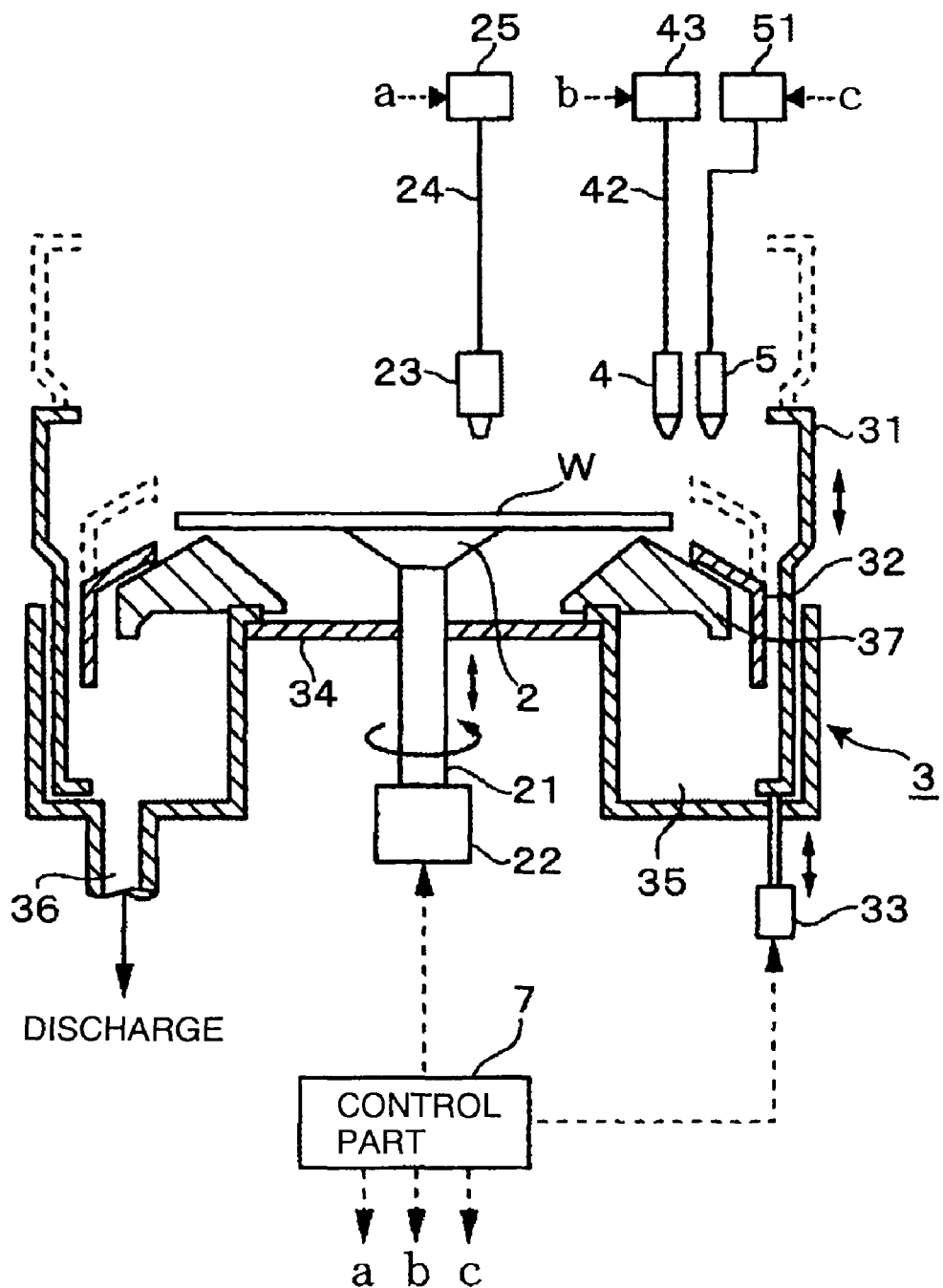
FIG. 1 is a longitudinal sectional view showing a substrate cleaning apparatus in a first embodiment according to the present invention, which is combined with a development apparatus.

A first embodiment of a substrate cleaning apparatus according to the present invention is described. The apparatus is combined with (integrated with) a development apparatus. In FIG. 1, the reference number 2 depicts a spin chuck which is a substrate holder that sucks and absorbs a central part of a rear surface of a substrate such as a wafer W, so as to hold the wafer W in a horizontal posture. The spin chuck 2 is connected via a rotation shaft 21 to a drive mechanism 22 including a rotation mechanism, and is configured to be capable of being rotated and moved in a vertical direction, with the wafer W being held by the spin chuck 2. In this example, a center of the wafer W is designed to be positioned on the rotation shaft 21 of the spin chuck 2.

A cup member 3 having an upper opening is disposed to surround the wafer W placed on the spin chuck 2. The cup member 3 is composed of an outer cup 31 whose upper part is a rectangular hollow pillar and whose lower part is cylindrical, and a cylindrical inner cup 32 whose upper part is inclined inward. The outer cup 31 can be vertically moved by an elevation part 33 connected to a lower end of the outer cup 31, and the inner cup 32 can be vertically moved by means of a stepped part formed in a lower-end-side inner circumferential surface of the outer cup 31.

A circular plate 34 is disposed below the spin chuck 2. A liquid reception part 35 having a recessed cross-section is disposed outside the circular plate 34 to fully surround the same. A drain outlet port 36 is formed in a bottom surface of the liquid reception part 35. A developer and a cleaning liquid, which have been spilled from or spun out from the wafer W and received in the liquid reception part 35, are discharged outside the apparatus through the drain outlet port 36. In addition, a ring member 37 having a chevron-like cross-section is disposed outside the circular plate 34. Although not shown, there are provided a plurality of, e.g., three elevation pins as substrate support pins passing through the circular plate 34. By a cooperation of the elevation pins and a substrate transfer member, not shown, the wafer W can be transferred to and from the spin chuck 2.

Figure 2:
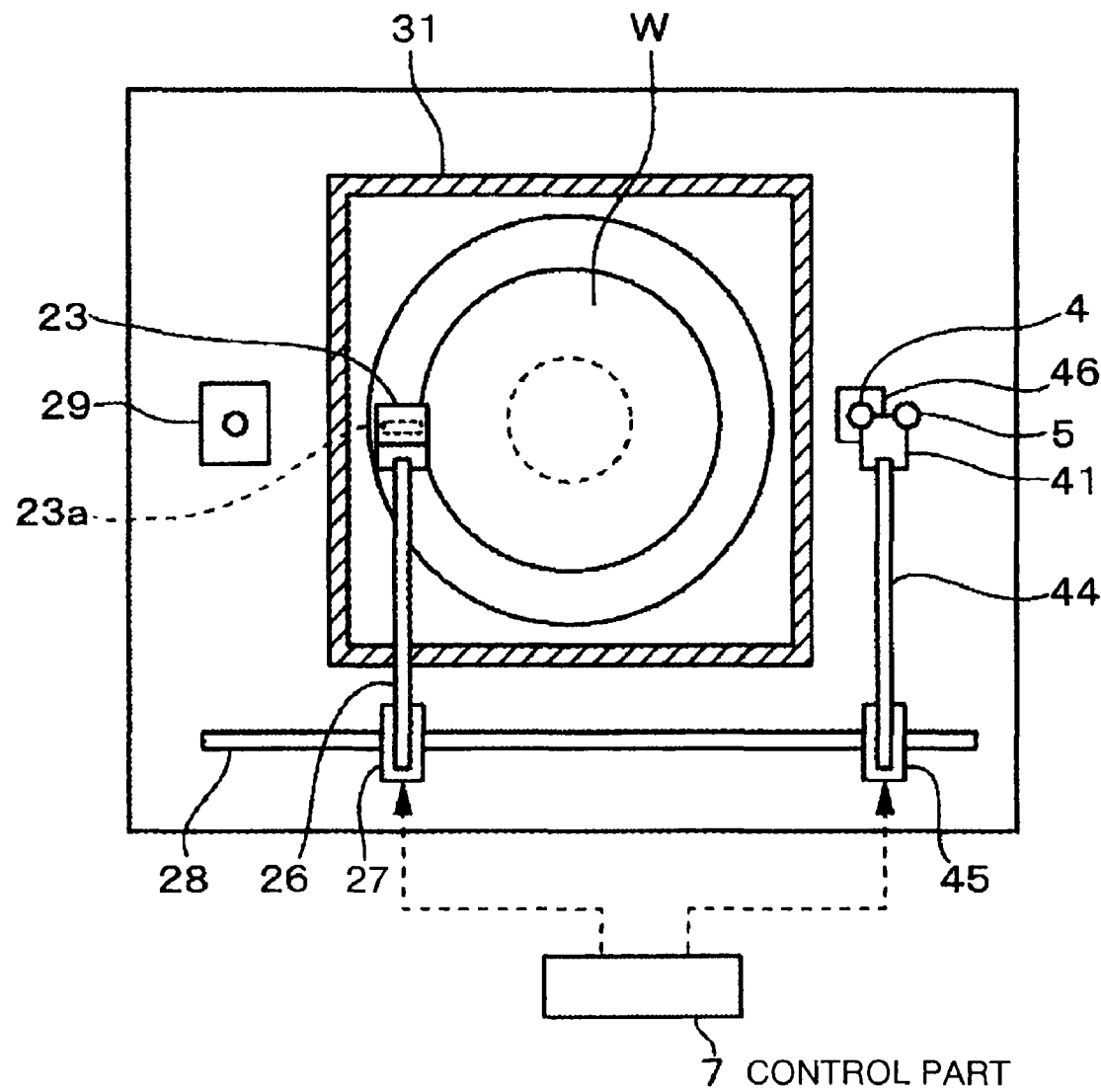
FIG. 2 is a plan view showing the substrate cleaning apparatus in the first embodiment.

The development apparatus (serving as the substrate cleaning apparatus) in this embodiment is further equipped with a developer nozzle 23, a cleaning-liquid nozzle 4, and a gas nozzle 5. The developer nozzle 23 has a strip-like discharge opening, such as a slit-like discharge opening 23a (see FIG. 2), which is extended in a diametric direction of the wafer W held by the spin chuck 2. The nozzle 23 is connected to a developer supply system 25 through a developer supply channel 24 such as a pipe. The developer supply system 25 includes a developer supply source, a supply controller, and so on.

The developer nozzle 23 is supported on one end of a nozzle arm 26 which is a support member. The other end of the nozzle arm 26 is connected to a movable body 27 having an elevation mechanism, not shown. The movable body 27 is configured to be capable of being laterally moved along, e.g., a guide member 28 that is extended in an X direction on a bottom surface of a housing of the unit, by a drive source, not shown. The drive source constitutes a movement mechanism together with the elevation mechanism of the movable body 27. In the drawings, the reference number 29 is a waiting position of the developer nozzle 23. At the nozzle waiting position 29, a nozzle end of the developer nozzle 23 is cleaned.

Figure 3:
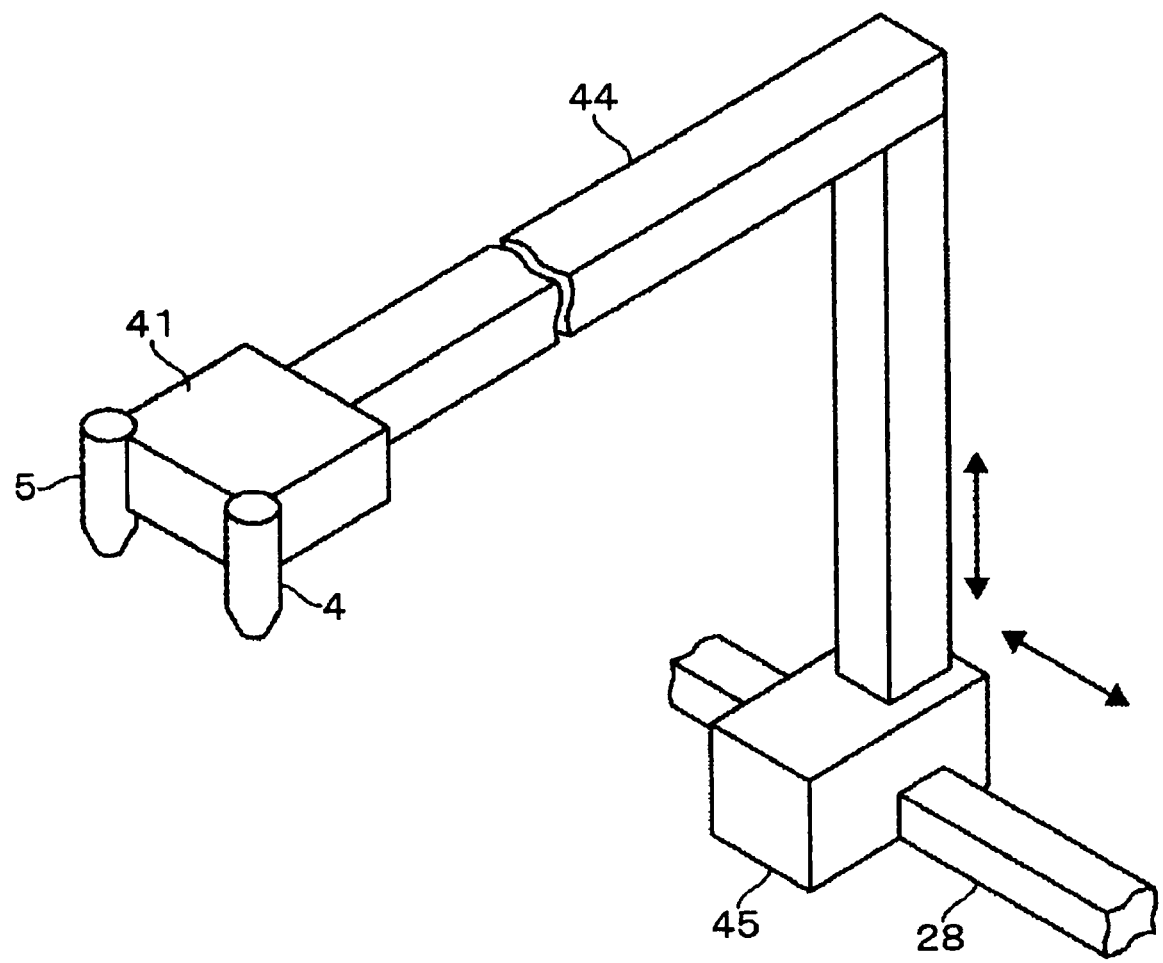
FIG. 3 is a perspective view showing a cleaning-liquid nozzle, a gas nozzle, and other structural members around them, of the substrate cleaning apparatus in the first embodiment.

The cleaning-liquid nozzle 4 has a discharge opening 40 (see FIG. 4), and is connected to a cleaning-liquid supply system 43 through a cleaning-liquid supply channel 42 such as a pipe. The cleaning-liquid supply system 43 includes a cleaning-liquid supply source, a supply controller, and so on. The supply controller has a pump whose discharge rate can be controlled, a valve, and the like. In addition, as shown in FIG. 3, the cleaning-liquid nozzle 4 is fixed to a nozzle arm 44 via a nozzle holder 41. The nozzle arm 44 is connected to a movable body 45 having an elevation mechanism. The movable body 45 is configured to be capable of being laterally moved along the guide member 28 so as not to interfere with the developer nozzle 23, by a drive source, not shown, which constitutes another movement mechanism together with the elevation mechanism of the movable body 45. In the drawings, the reference number 46 depicts a waiting position of the cleaning-liquid nozzle 4.

The gas nozzle 5 is connected to a gas supply system 51 through a pipe. In this embodiment, the gas supply system 51 includes a supply source for supplying an inert gas such as an $N_2$ (nitrogen) gas, a supply controller, and so on. The gas nozzle 5 is fixed on the nozzle holder 41, for example, (FIG. 3). The gas nozzle 5 can be moved together with the cleaning-liquid nozzle 4 by means of the nozzle arm 44.

Figure 4:
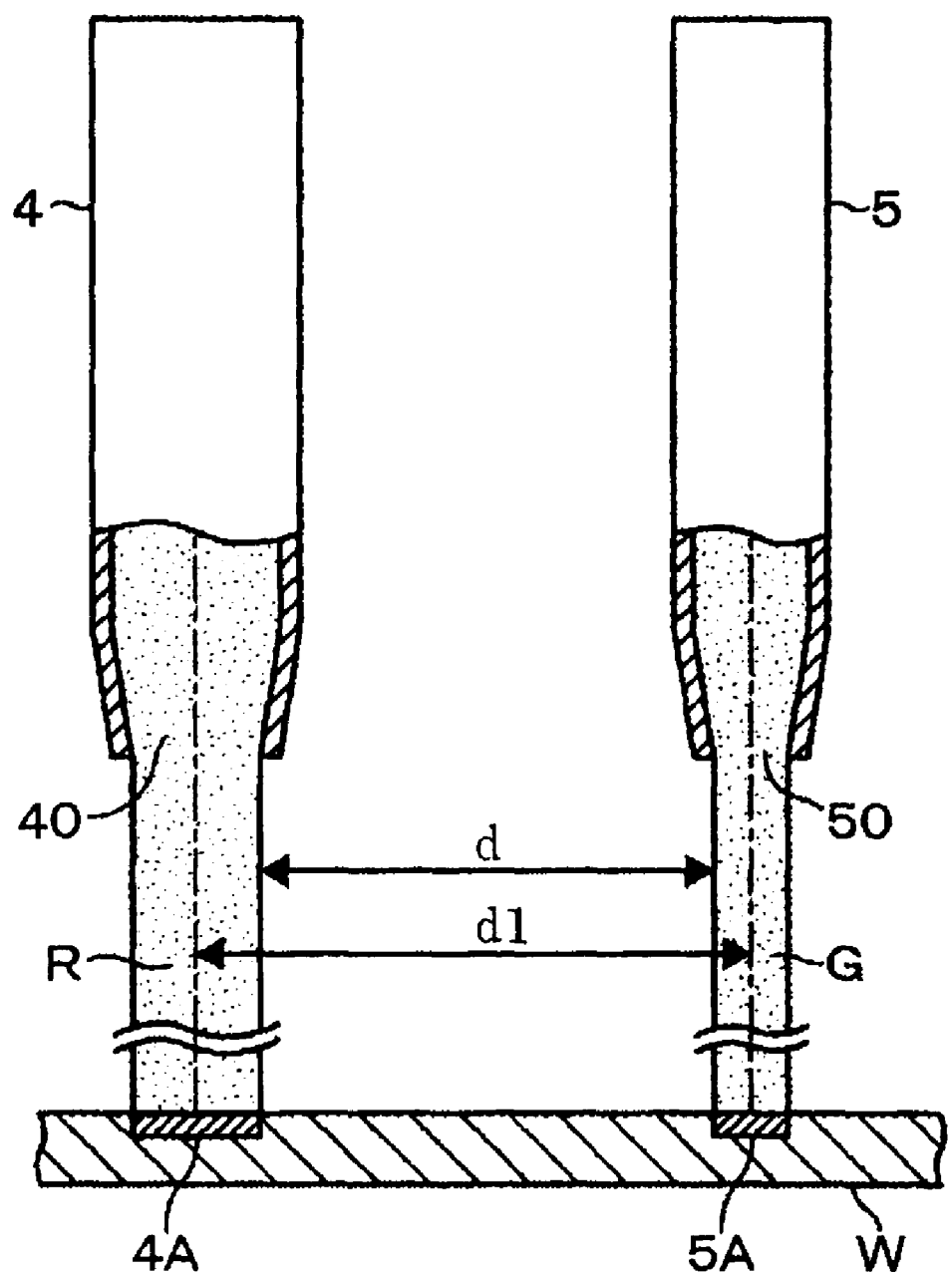
FIG. 4. is a partial sectional side view of the cleaning-liquid nozzle and the gas nozzle used in the substrate cleaning apparatus in the first embodiment.

Next, positions of the cleaning-liquid nozzle 4 and the gas nozzle 5, which are distant from each other, are described with reference to FIG. 4. FIG. 4 shows a state in which a cleaning liquid R and an $N_2$ gas G are discharged. In FIG. 4, the reference number 4A depicts a to-be-discharged (supplied) position of the cleaning liquid, onto which the cleaning liquid is to be discharged from the discharge opening 40 of the cleaning-liquid nozzle 4, and the reference number 5A depicts a to-be-discharged (supplied) position of the gas, onto which the gas is to be discharged from the discharge opening 50 of the gas nozzle 5. The cleaning-liquid to-be-discharged position 4A is a projection of the discharge opening 40 onto the wafer W in a to-be-discharged direction of the cleaning liquid, and the gas to-be-discharged position 5A is a projection of the gas opening 50 onto the wafer W in a to-be-discharged direction of the gas. A distance d between an interface on a side of the gas to-be-discharged position 5A of the cleaning-liquid to-be-discharged position 4A and an interface on a side of the cleaning-liquid to-be-discharged position 4A of the gas to-be-discharged position 5A is set between 9 mm and 15 mm. As described below, the distance d is most preferably 12.35 mm. In this embodiment, the respective discharge openings 40 and 50 are positioned such that the distance d is set to this dimension. In this embodiment, a bore diameter of the discharge opening 40 of the cleaning-liquid nozzle 4 is 4.3 mm, and a bore diameter of the discharge opening 50 of the gas nozzle 5 is 1.0 mm. A distance d1 between a center of the to-be-supplied position of the cleaning liquid R and a center of the to-be-supplied position of the gas G is 15 mm.

In FIG. 1, the reference number 7 depicts a control part formed of a computer. The control part 7 has a program for executing the respective below steps with the use of the development apparatus. Based on this program, the control part 7 is configured to output control signals for controlling the developer supply system 25, the movement mechanism for moving the developer nozzle 23, the cleaning-liquid supply system 43, the movement mechanism for moving the cleaning-liquid nozzle 4, the drive mechanism 22 for driving the spin chuck 2, and the elevation part 33 of the outer cup 31. The program is usually stored in a storage medium such as a hard disc, a compact disc, a flash memory, a flexible disc, and a memory card. Then, the program is used by being installed in a computer from the storage medium.

Next, there are described a series of steps for developing and then cleaning a wafer W as a substrate with the use of the aforementioned development apparatus. At first, a wafer W whose surface has been subjected to a resist application process and an immersion exposure process is loaded by a substrate transfer member, not shown, under a state in which the outer cup 31 and the inner cup 32 are located in their lowered positions and the developer nozzle 23, the cleaning-liquid nozzle 4 and the gas nozzle 5 are respectively waiting at their predetermined waiting positions. Then, the wafer W is transferred to the spin chuck 2 by a cooperation of the substrate transfer member and the elevation pins, not shown. In this embodiment, a highly water-repellent material is used as the resist, and thus a static contact angle with respect to water on the surface of the wafer W is, e.g., 90 degrees.

Figure 5:
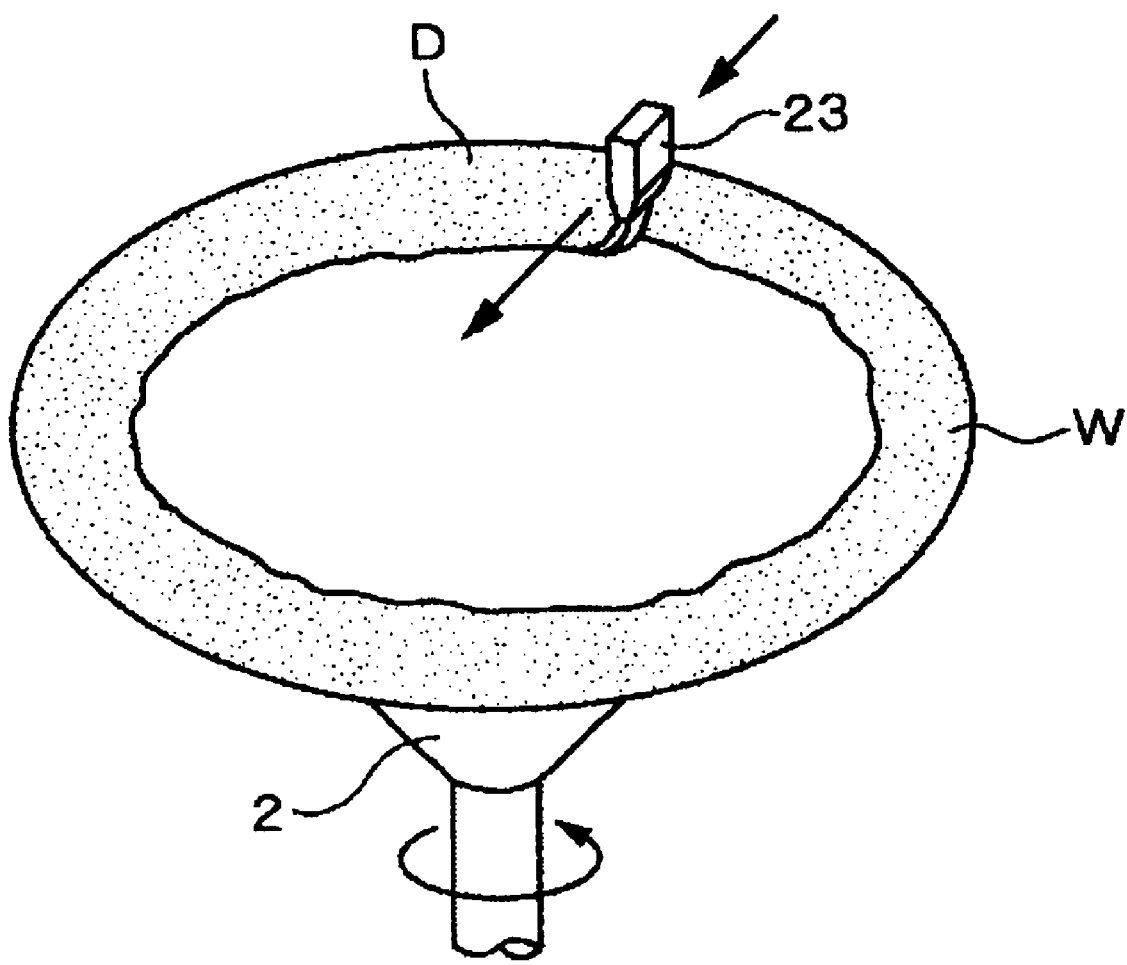
FIG. 5 is a perspective view for explaining an example of a method for supplying a developer to a wafer.

Then, the outer cup 31 and the inner cup 32 are elevated to their raised positions, and a developer is supplied from the developer nozzle 23 onto the wafer W. The supply of the developer is performed by a known method. In this embodiment, for example, the discharge opening 23a of the developer nozzle 23 is set at a position which is higher than the surface of the wafer W by several millimeters. Thereafter, the wafer W is rotated at a rotation speed between 1000 and 1200 rpm, for example. Under this state, the developer nozzle 23 is moved in a rotational radial direction of the wafer W, i.e., the developer nozzle 23 is moved from an outer side of the wafer W toward a center side thereof, with the developer D being discharged like a strip (belt) from the discharge opening 23a. As schematically shown in FIG. 5, for example, the developer D discharged like a strip from the discharge opening 23a is laid on the surface of the wafer W from the outside thereof to the inside thereof such that no void is left, and thus the developer D is substantially helically supplied over all the surface of the wafer W. Because of the effect of a centrifugal force of the rotating wafer W, the developer D is spread outward along the surface of the wafer W, so that a thin liquid film is formed on the surface of the wafer W. Then, a soluble part of the resist is dissolved in the developer D, so that an insoluble part is left to form a pattern.

Following thereto, the developer nozzle 23 is displaced by the cleaning-liquid nozzle 4, such that the cleaning-liquid nozzle 4 is positioned above the central part of the wafer W. Immediately after the developer nozzle 23 has stopped the supply of the developer, the cleaning liquid R is promptly discharged from the cleaning-liquid nozzle 4 so as to clean the surface of the wafer W. The cleaning process is described herebelow with reference to FIGS. 6 and 7. This cleaning process is performed by the following steps.

Figure 6A:
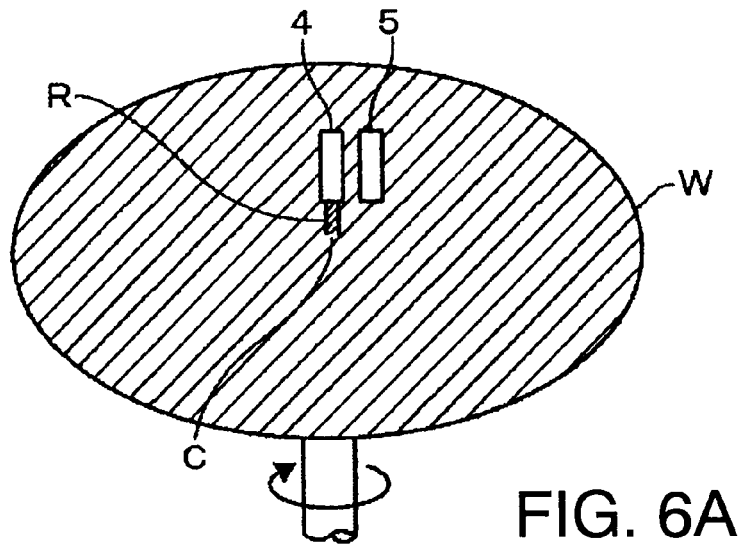
FIGS. 6A to 6C are explanatory views showing stepwise states in which a developed wafer is cleaned by using the substrate cleaning apparatus in the first embodiment.
Figure 7A:
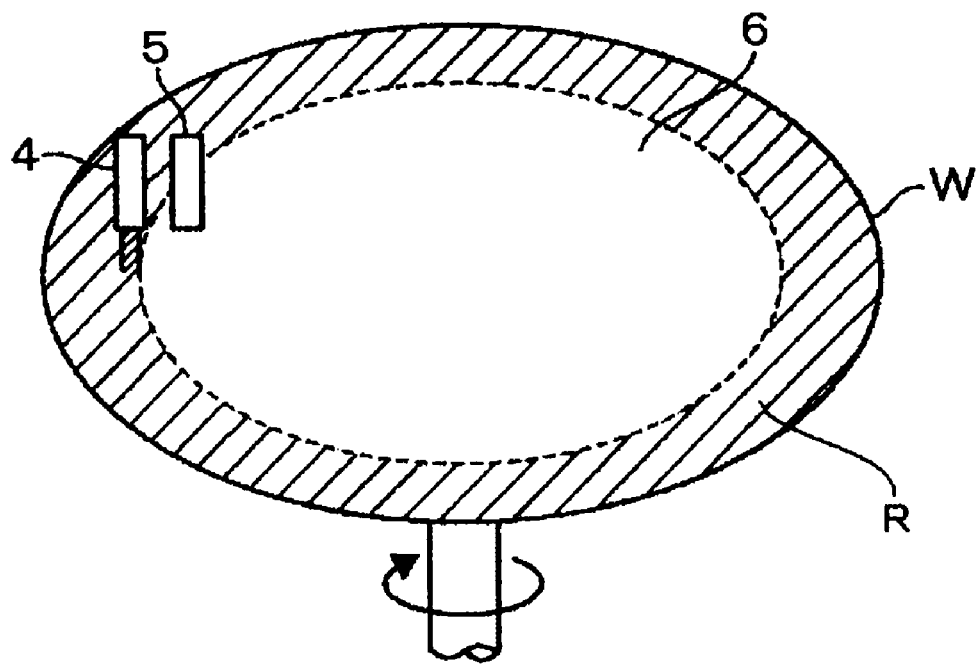
FIGS. 7A and 7B are explanatory views, following FIG. 6C, showing stepwise states in which the developed wafer is cleaned.

Step 1: As shown in FIG. 6A, the cleaning-liquid nozzle 4 is set to be opposed to the central part C of the wafer W at a 15-mm high position, for example, from the surface of the wafer W. Then, with the spin chuck 2 being rotated at a rotation number of, e.g., 1000 rpm, the cleaning liquid R such as a pure water is discharged at a flow rate of, e.g., 250 ml/minute, for, e.g., 5 seconds, from the cleaning-liquid nozzle 4 to the central part C of the wafer W. Thus, the cleaning liquid R is spread from the central part C of the wafer W to a periphery thereof by the centrifugal force, so that the developer is cleaned off by the cleaning liquid R. Herein, the central part C of the wafer W means a central point of the wafer W and also an area near thereto.

Figure 6B:
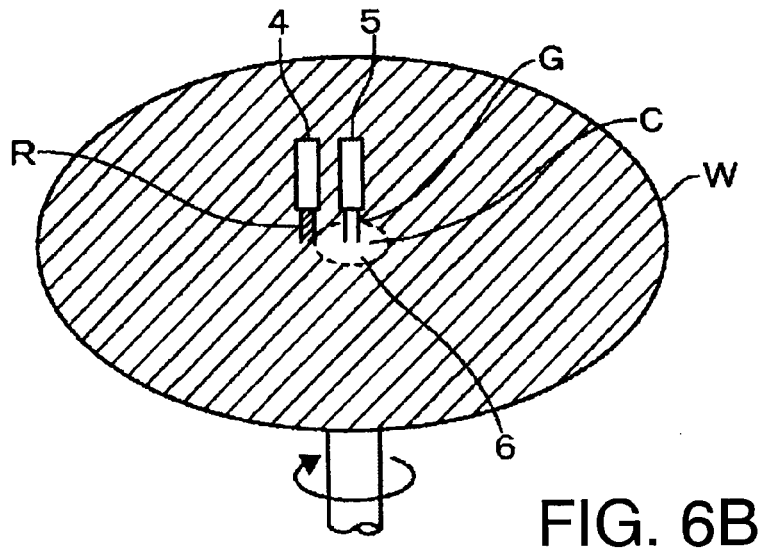

Step 2: Then, as shown in FIG. 6B, while the spin chuck 2 is being rotated at a rotation number of 1500 rpm or more, e.g., 2000 rpm, the nozzle arm 44 (see FIG. 2) is moved so that the cleaning-liquid nozzle 4 is slightly moved outward from the central part C of the wafer W. Thus, the gas nozzle 5 is positioned to be opposed to the central part C of the wafer W. At this time, the cleaning-liquid nozzle 4 is moved at a speed of, e.g., 150 mm/second, while the cleaning-liquid nozzle 4 is discharging the cleaning liquid R at a flow rate of, e.g., 250 ml/minute. Then, the nozzle arm 44 temporarily stops there, and the gas nozzle 5 starts to eject a gas, for example an inert gas such as an $N_2$ gas G, to the central part C of the wafer W, immediately after the gas nozzle 5 has been opposed to the central part C.

Figure 8:
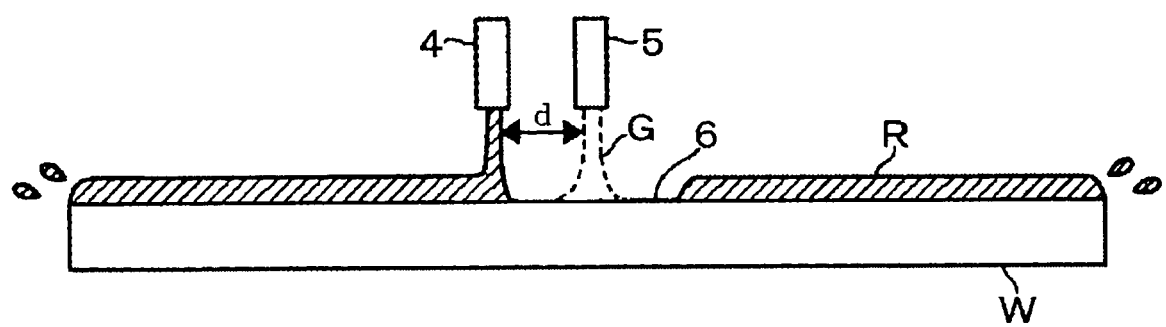
FIG. 8 is an explanatory view showing a state in which a dried area is spread by discharging an $N_2$ gas to a central part of the wafer.

After the cleaning-liquid nozzle 4 has been moved outward from the central part C of the wafer W, the cleaning liquid R is not supplied to the central part C. However, since the centrifugal force at the central part C is relatively small, a liquid film of the cleaning liquid R is not torn but maintained as it is for a while at the central part C. However, as shown in FIG. 8, the liquid film is torn by the $N_2$ gas G ejected from the gas nozzle 5, so that a dried area 6, in which the surface of the wafer W is exposed, is generated. The dried area 6 is then spread by the centrifugal force. At this time, since the surface of the wafer W is highly water-repellent, namely, since a contact angle with respect to water is as large as 90 degrees, the dried area 6 is spread at once up to a position onto which the cleaning liquid R is just discharged. The dashed line in FIG. 6B depicts a periphery of the dried area 6, and thus an area surrounded by the dashed line is the dried area 6. As described above, the distance d between the interface on the side of the gas to-be-discharged position 5A of the cleaning-liquid to-be-discharged position 4A and the interface on the side of the cleaning-liquid to-be-discharged position 4A of the gas to-be-discharged position 5A is 12.35 mm, and the nozzles 4 and 5 are integrally moved. Thus, the dried area 6 at this time has a circular shape whose diameter is about 25 mm.

In the step 1, since the cleaning liquid R is discharged to the central part C of the wafer W and is spread outward, an amount of the cleaning liquid R per unit area is larger in an area whose diameter is not more than 25 mm. In addition, although the centrifugal force contributes to the spread of the cleaning liquid R, an impact caused by the collision of the discharged cleaning liquid R against the central part C more contributes to the spread of the cleaning liquid R. For these reasons, a high cleaning efficiency is produced in this area. Thus, even when the dried area 6 is spread at once, the phenomenon shown in FIG. 27B does not occur at all, which can be inferred by the below evaluation tests. Namely, the cleaning liquid R in a recess of the pattern can be discharged off without fail.

Figure 6C:
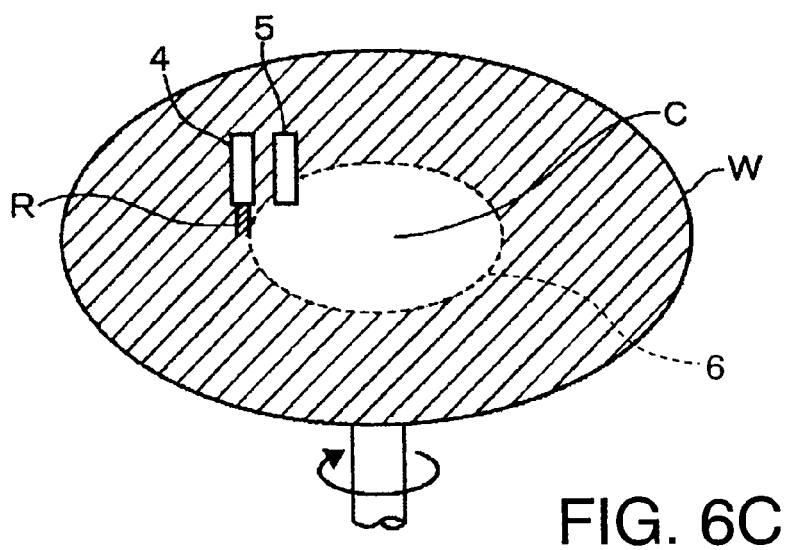

Step 3: After the dried area 6 has been formed, the discharge of the gas is stopped. Following thereto, as shown in FIG. 6C, the cleaning-liquid nozzle 4 and the gas nozzle 5 are integrally moved by the nozzle arm 44 toward the periphery of the wafer W. A time period from when the supply of the gas for forming the dried area 6 is started to when the supply of the gas is stopped is, e.g., 0.5 seconds.

Figure 9:
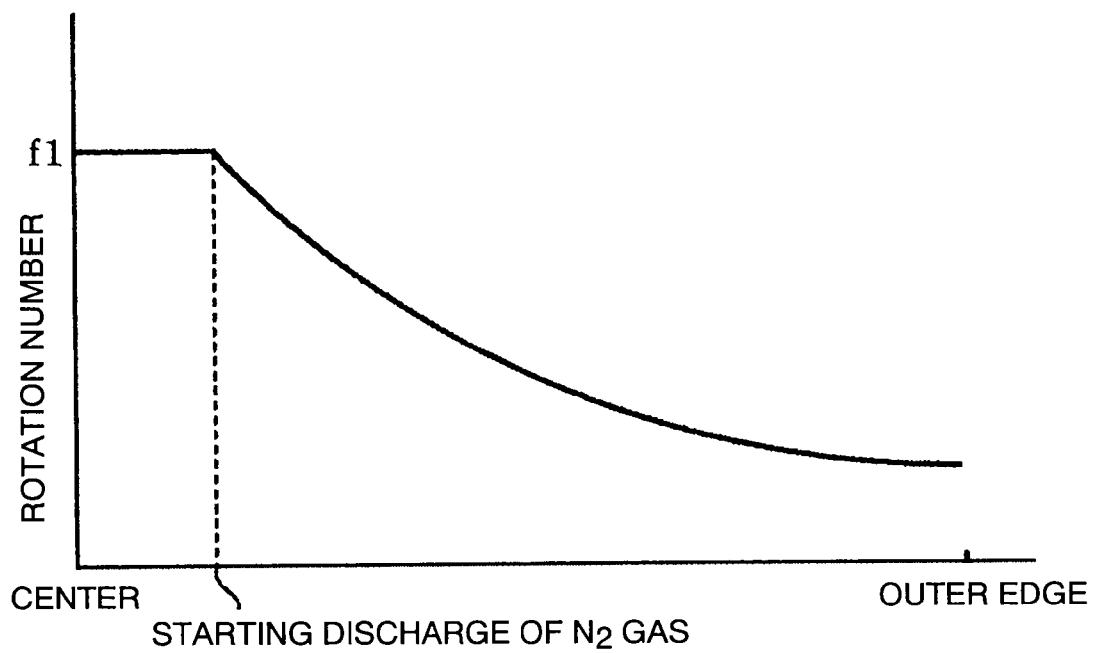
FIG. 9 is a graph showing a relationship between a to-be-discharged position of a cleaning liquid and a rotation number of the wafer.
Figure 27A:
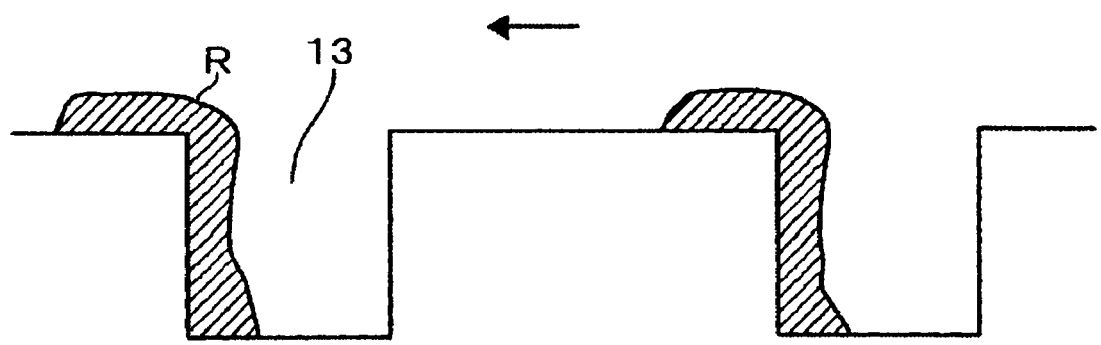
FIGS. 27A and 27B are explanatory views schematically showing states in which a wafer surface is cleaned by a conventional cleaning method.
Figure 27B:
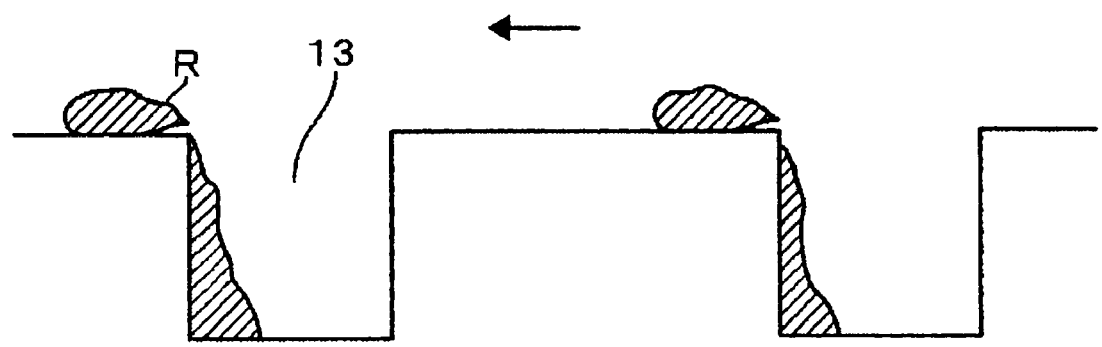

In the step 3, while the wafer W is being rotated, the cleaning liquid R is discharged from the cleaning-liquid nozzle 4. A speed at which the cleaning-liquid nozzle 4 is moved is set at a speed of, e.g., 5 mm/second, which is lower than a speed at which the dried area 6 is spread outward. The "speed at which the dried area 6 is spread outward" is defined as follows. After the cleaning liquid has been discharged by the cleaning-liquid nozzle 4 to the central part C of the wafer W, and only the $N_2$ gas G has been ejected to the central part C of the wafer W without the cleaning liquid being discharged, the dried area is spread outward. The "speed at which the dried area 6 is spread outward" means a speed at that time. Since the water repellency of the surface of the wafer W is high, the speed at which the dried area 6 is spread is fast, which is as described above. Thus, when the moving speed of the cleaning liquid nozzle 4 is faster than the speed at which the dried area 6 is spread, the cleaning liquid R may remain in the recess as shown in FIG. 27B. As shown in FIG. 9, a rotation number of the wafer W is controlled such that the centrifugal force caused by the rotation of the wafer W is calculationally constant at every discharged position of the cleaning liquid R. A rotation number f1 when the step 3 is started is, e.g., 2000 rpm.

The purpose for controlling the rotation number is to make uniform an amount of the cleaning liquid R to be supplied per unit area on the wafer W, to thereby improve a cleaning effect even in an area remote from the central part C of the wafer W. As long as such an effect is produced, the centrifugal force caused by the rotation of the wafer W may be inconstant at every discharged position of the cleaning liquid R. For example, it is possible to control the rotation number of the wafer W such that the rotation number of the wafer W is increased as the supplied (to-be-supplied) position of the cleaning liquid R comes closer to the center of the wafer W, in other words, the rotation number of the wafer W is decreased as the supplied (to-be-supplied) position of the cleaning liquid R comes closer to the periphery of the wafer W.

The rotation number f1 when the step 3 is started is preferably between, e.g., 2000 rpm and 3000 rpm. When the rotation number is larger than 3000 rpm, mist is disadvantageously generated. On the other hand, when the rotation number is smaller than 2000 rpm, the speed at which the dried area 6 is spread becomes lower so that a process period is elongated. In terms of reduction in the process period, it is preferable that the moving speed of the nozzles in the step 3 is increased as much as possible. However, the cleaning effect is impaired when the moving speed is too fast. Thus, preferably, the moving speed does not exceed 10 mm/second.

Figure 7B:
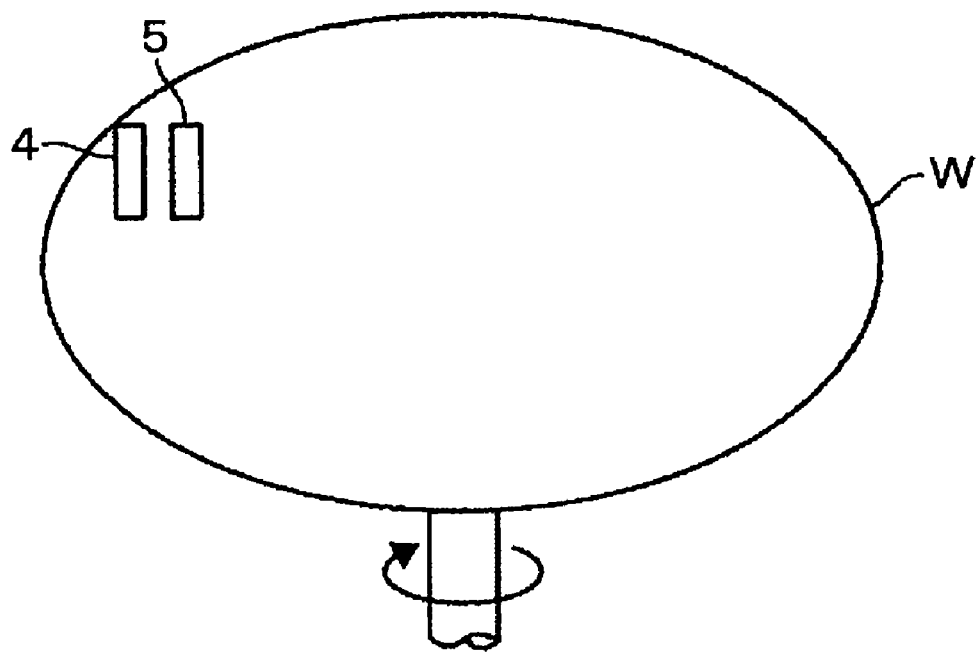

When the center of the cleaning-liquid nozzle 4 reaches a position slightly distant from the periphery of the wafer W toward the center thereof, e.g., a position distant from the periphery of the wafer W by 2 to 10 mm toward the center thereof (FIG. 7A), the discharge of the cleaning liquid R from the cleaning-liquid nozzle 4 is stopped. On the other hand, the rotation of the wafer W is continued (FIG. 7B). When the cleaning liquid R from the cleaning-liquid nozzle 4 is discharged up to the periphery of the wafer W, the cleaning liquid R that has been discharged onto the surface of the wafer W may spatter outside to become mist, and may return to the surface of the wafer W. Thus, it is preferable that the discharge of the cleaning liquid R is stopped just before the discharge of the cleaning liquid R from the cleaning-liquid nozzle 4 reaches the periphery of the wafer W. In the step of moving the cleaning-liquid nozzle 4, the gas may be discharged together with the cleaning liquid. In this case, a timing at which the discharge of the $N_2$ gas G is stopped may be the same as the timing at which the discharge of the cleaning liquid R is stopped. Alternatively, the timing at which the discharge of the $N_2$ gas G is stopped may be before or after the timing at which the discharge of the cleaning liquid R is stopped.

Step 4: Even after the discharge of the cleaning liquid R from the cleaning-liquid nozzle 4 has been stopped, the wafer W is rotated at the same rotation number (in this embodiment, the rotation number of 2000 rpm). Thus, the dried area 6 is spread outside. After the dried area 6 has been spread to reach the periphery of the wafer W, the rotation number of the wafer W is continuously set (maintained) at 2000 rpm, so that liquid droplets on the wafer W are completely spun off by the centrifugal force so as to dry the wafer W. The cleaning-liquid nozzle 4 and the gas nozzle 5 are returned to their waiting positions.

A recess for forming the pattern is formed in the developed wafer W. An inside of the recess becomes hydrophilic, and thus there is a portion at which the contact angle of the surface of the wafer W is lowered. The target of the present invention is a substrate having a hydrophobic surface whose contact angle with respect to water is 85 degrees or more. In this embodiment, there is described the cleaning step for a substrate having a hydrophobic surface whose static contact angle with respect to water is 85 degrees or more before the substrate is subjected to the development process. When the substrate is cleaned after the substrate has been subjected to a development process, in which a developer is supplied to the substrate, the condition that a static contact angle with respect to water of the substrate is 85 degrees or more means that a static contact angle with respect to water of the substrate is 85 degrees or more before the substrate is subjected to the development process. From such a reason that conditions of the surface of the resist may be changed by the developer, even when the substrate has the surface whose static contact angle with respect to water is 85 degrees or more before the substrate is subjected to the development process, there is a possibility that the static contact angle with respect to water of the resist might become slightly lower than 85 degrees at the cleaning process. However, since the cleaning process is needed to be performed immediately after the development process, it is difficult to exactly measure the static contact angle between the development process and the cleaning process. Thus, the static contact angle is defined as described above.

The aforementioned series of steps 1 to 4 are performed by the CPU, which reads out the program stored in the memory of the control part 7 and outputs control signals for operating the above-described respective mechanisms according to the program (read-out instruction).

According to the above embodiment, when a wafer W, which has a highly water-repellent resist surface whose contact angle with respect to water on its surface is 85 degrees or more, is developed and then spin-cleaned, the spin-cleaning process is performed as follows. After the cleaning liquid R has been supplied to the central part C of the wafer W, the to-be-supplied position of the cleaning liquid R is moved from the central part to an eccentric position, and the gas is supplied to the central part C of the wafer W from the gas nozzle 5 to thereby generate the dried area 6 of the cleaning liquid R, under the conditions in which the distance between the interface on the side of the gas to-be-discharged position of the to-be-discharged position of the cleaning liquid in the wafer W and the interface on the side of the cleaning-liquid to-be-discharged position of the to-be-discharged position of the gas in the wafer W is set between 9 mm and 15 mm. Thereafter, while the wafer W is being rotated, the to-be-supplied position of the cleaning liquid R is moved toward the periphery of the wafer W at a speed lower than a speed at which the dried area 6 is spread outward. Thus, a high cleaning effect can be produced, so that the number of development faults can be reduced to almost zero, which is apparent from the below evaluation tests, whereby a yield rate can be significantly improved. In addition, the cleaning process can be performed for a shorter period. When the rotation number of the wafer W is controlled such that the rotation number of the wafer W is decreased as the supplied position of the cleaning liquid R comes closer to the periphery of the wafer W to make uniform an amount of the cleaning liquid R to be supplied per unit area on the wafer W, a high cleaning effect can be produced even in an area remote from the central part C of the wafer W. Therefore, the aforementioned method is remarkably effective especially when an immersion exposure process is performed with the use of a highly water-repellent resist without a protective film.

An important requirement (condition) of the present invention is that, in the step 2, i.e., when the dried area 6 is formed, "the gas is discharged to the central part of the wafer W, under the conditions in which the distance between the interface on the side of the to-be-discharged position of the gas in the to-be-discharged position of the cleaning liquid in the wafer W and the interface on the side of the to-be-discharged position of the cleaning liquid in the to-be-discharged position of the gas in the wafer W is set between 9 mm and 15 mm". A significance of the present invention is based on a discovery of the appropriate value of the distance d from the below experiments.

[Second Embodiment]

Figure 10A:
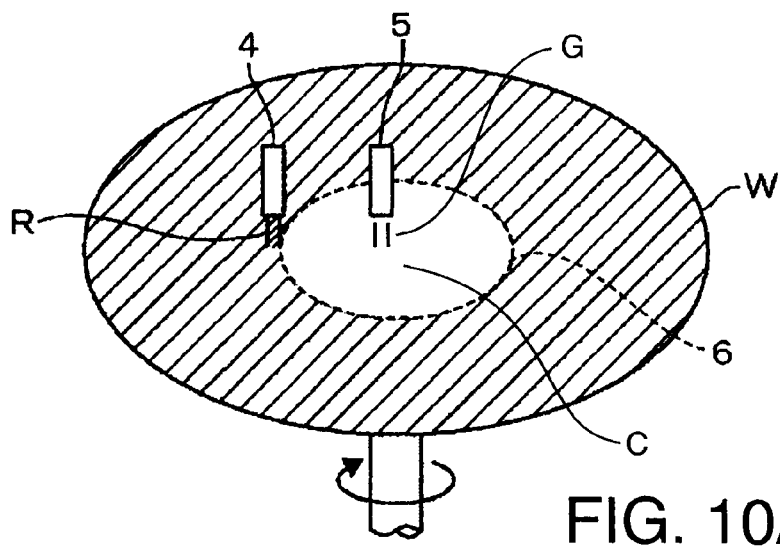
FIGS. 10A to 10C are explanatory views showing stepwise states in which a developed wafer is cleaned by using a substrate cleaning apparatus in a second embodiment according to the present invention.
Figure 10B:
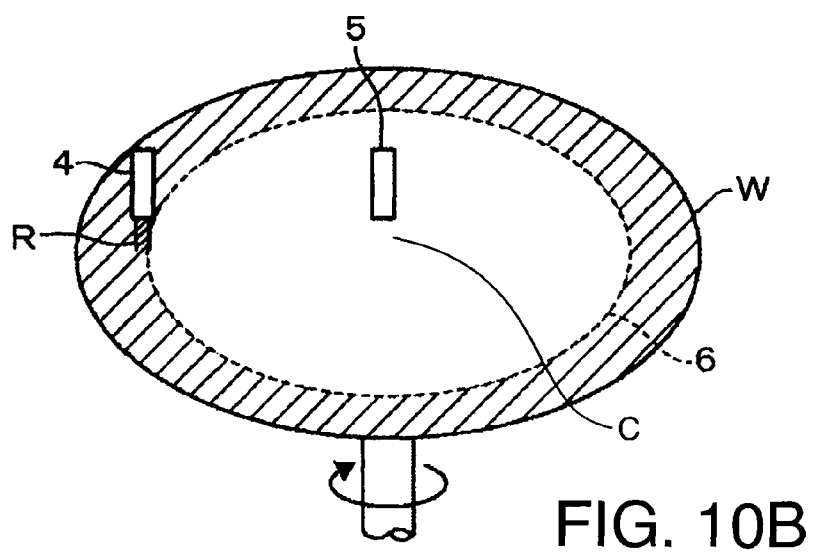
Figure 10C:
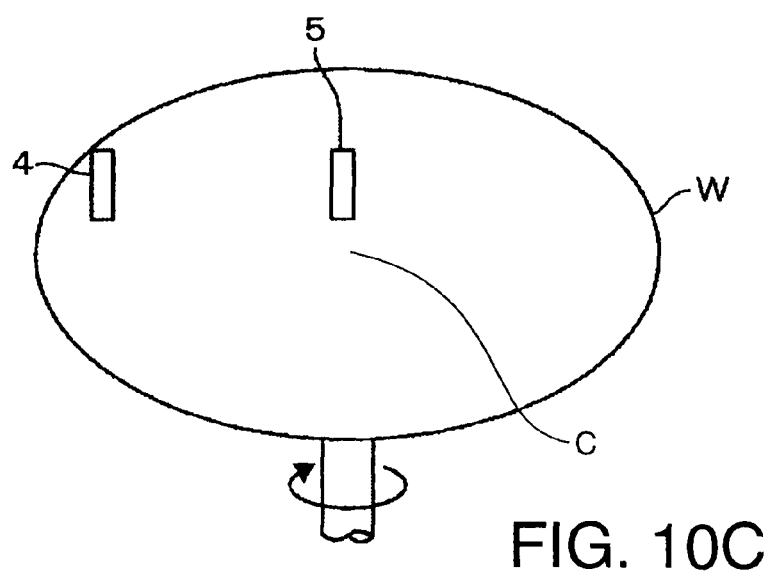

In this embodiment, a cleaning-liquid nozzle 4 and a gas nozzle 5 can be independently moved by separate nozzle arms. At first, a cleaning liquid is discharged from the cleaning-liquid nozzle 4 to a central part C of a wafer W. Subsequently, the cleaning-liquid nozzle 4 is slightly moved outward from the central part C of the wafer W, and the gas nozzle 5 is positioned to be opposed to the central part C of the wafer W. Then, an $N_2$ gas is supplied from the gas nozzle 5 to the central part C so as to form a dried area 6. Thereafter, the cleaning-liquid nozzle 4 is moved in a vicinity of a peripheral part of the wafer W, with the cleaning liquid R being discharged (FIGS. 10A and 10B). Then, the discharge of the cleaning liquid R is stopped, and the wafer W is dried (FIG. 10C). On the other hand, after the $N_2$ gas G has been supplied from the gas nozzle 5 to the central part C so as to form the dried area 6, the gas nozzle 5 stops the discharge of the $N_2$ gas G.

A separation distance between the cleaning-liquid nozzle 4 and the gas nozzle 5 at a timing of FIG. 6B is the same as that of the first embodiment. After the gas nozzle 5 has discharged the $N_2$ gas G to the central part C of the wafer W so as to form the dried area 6, the gas nozzle 5 may be positioned above the central part C which is shown in FIGS. 10A to 10B, or may be returned to a waiting position thereof. Also in this embodiment, the same effect as that of the first embodiment can be produced.

In this embodiment, after the operations shown in FIGS. 6A and 6B have been performed, when the cleaning-liquid nozzle 4 is moved, the $N_2$ gas G may be continuously discharged from the gas nozzle 5 to the central part C of the wafer W.

[Third Embodiment]

Since a developer and a cleaning liquid are supplied, an atmosphere inside the cup 31 is high in humidity. In particular, immediately after the cleaning liquid R has been supplied, humidity of the atmosphere surrounding the area onto which the cleaning liquid R has been supplied is raised. Thus, in the step 3 of the first embodiment, when the gas nozzle 5 following the cleaning-liquid nozzle 4 is moved from the central part C of the wafer W toward the peripheral part thereof, there is a possibility that moisture of the surrounding atmosphere might adhere to a surface of the gas nozzle 5 so as to form liquid droplets thereon. In this case, the liquid droplets may fall down from the gas nozzle 5 to the dried area 6 and enter a recess formed in the dried area 6 to thereby cause a development fault. Thus, there is described a third embodiment capable of restraining a development fault which might be caused by the falling liquid droplets.

Figure 11:
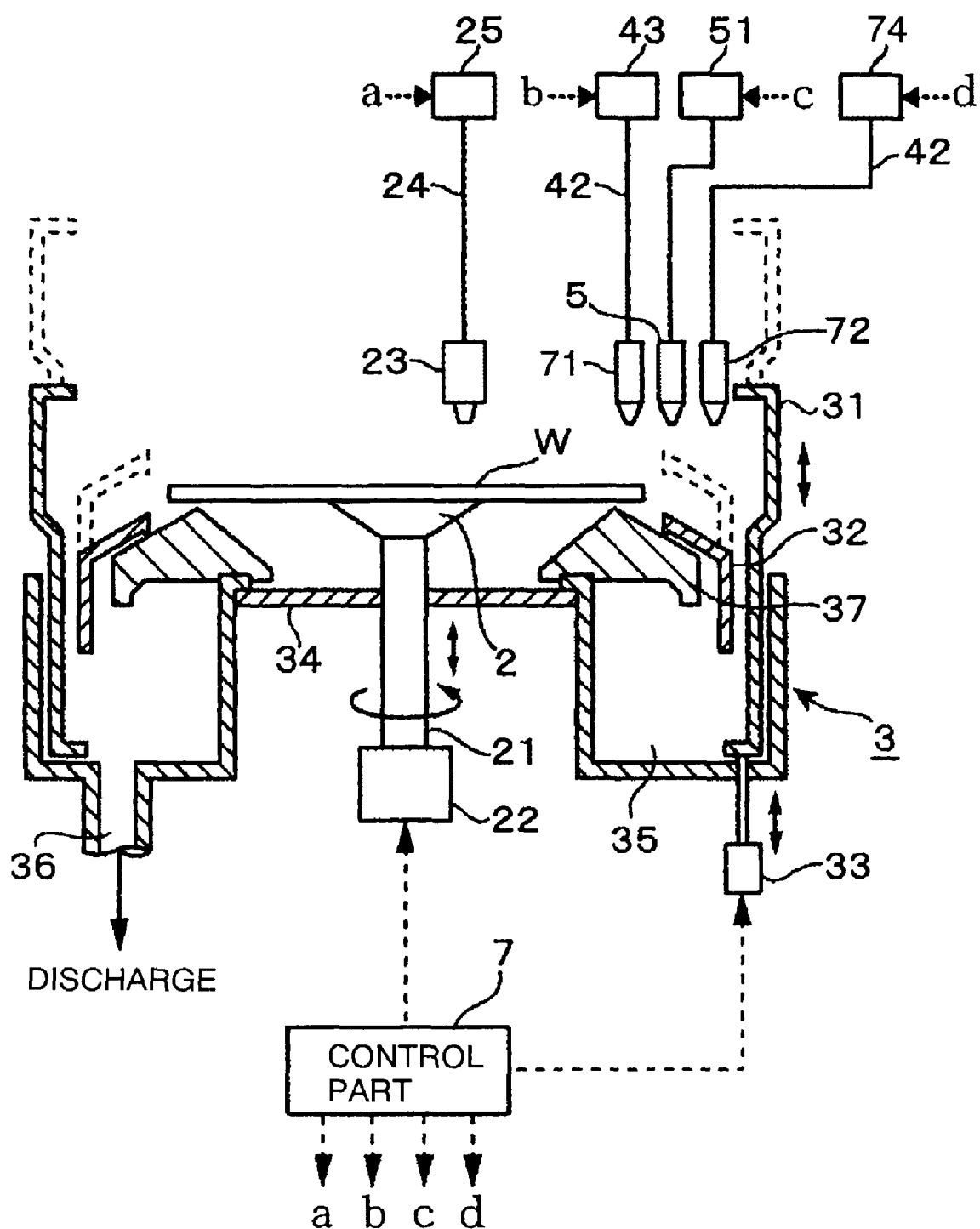
FIG. 11 is a longitudinal sectional view showing a substrate cleaning apparatus in a third embodiment according to the present invention, which is combined with a development apparatus.

FIG. 11 shows a development apparatus 70, which is structured substantially similarly to the development apparatus shown in FIG. 1. The parts which are structured similarly to those of the development apparatus shown in FIG. 1 are shown by the same reference numbers, and detailed description thereof is omitted, and differences between the development apparatus 70 and the development apparatus shown in FIG. 1 are mainly described. A first cleaning-liquid nozzle 71 disposed on the development apparatus 70 corresponds to the cleaning-liquid nozzle 4, and has the same structure as that of the cleaning-liquid nozzle 4. In addition, the development apparatus 70 is provided with a second cleaning-liquid nozzle 72 for supplying a cleaning liquid to a wafer W, which is independent from the first cleaning-liquid nozzle 71. Similarly to the first cleaning-liquid nozzle 71, the second cleaning-liquid nozzle 72 is connected through a cleaning-liquid supply channel 73 to a cleaning-liquid supply system 74, which has the same structure as that of the cleaning-liquid supply system 43.

Figure 12:
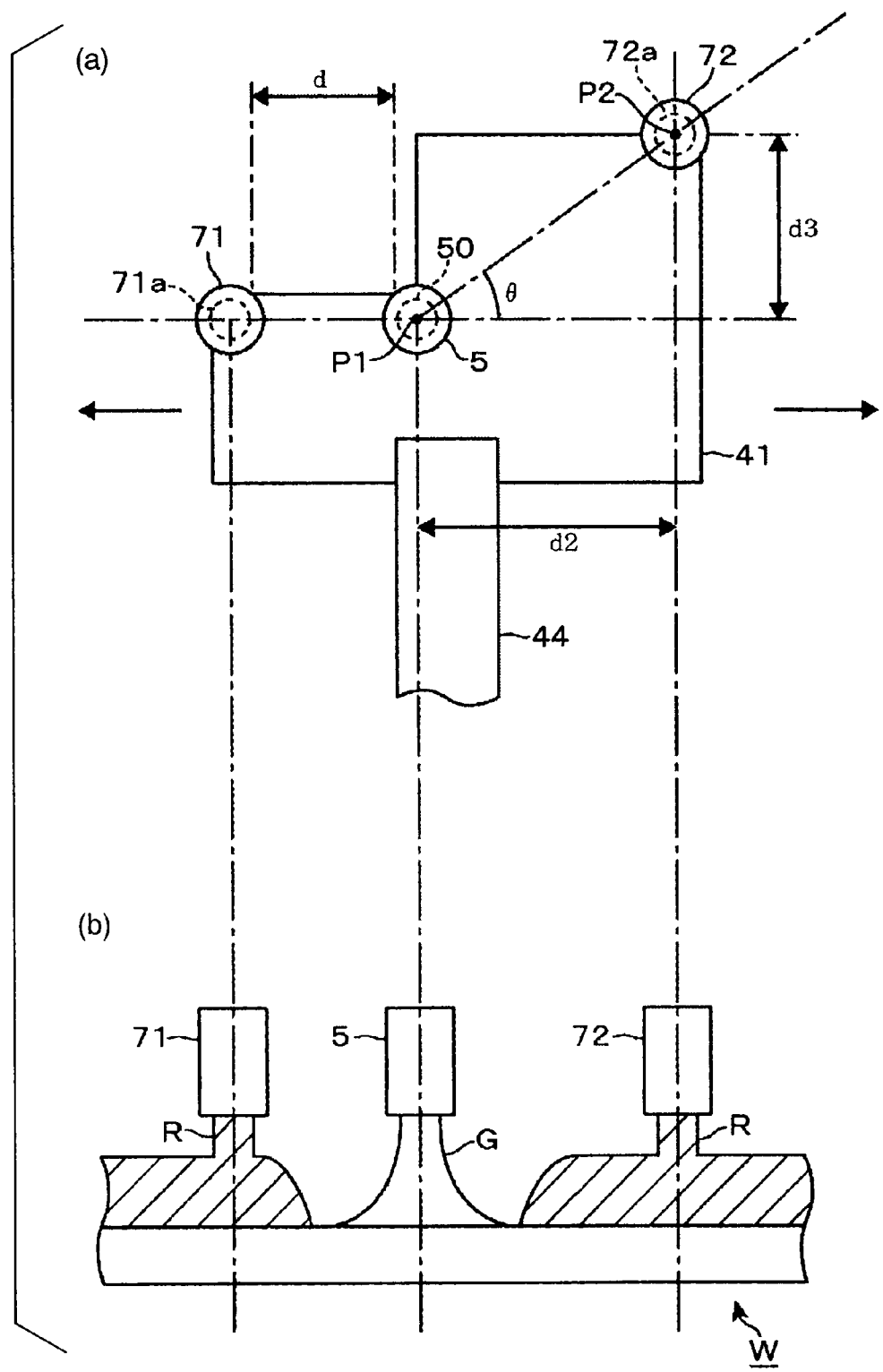
FIG. 12 is a structural view of a nozzle disposed in the substrate cleaning apparatus in the third embodiment.

As shown in FIG. 12A, the cleaning-liquid nozzles 71 and 72 and a gas nozzle 5 are fixed to a nozzle arm 44 via a nozzle holder 41, and are configured to be integrally moved in a radial direction of a wafer W, which is similar to the first embodiment. In the drawings, the reference numbers 71a and 72a depict cleaning-liquid discharge openings of the cleaning-liquid nozzles 71 and 72, respectively. As shown in FIG. 12B, the respective cleaning nozzles 71 and 72 are configured to discharge a cleaning liquid R vertically downward.

A distance d between an interface on a side of a to-be-discharged position of the gas in a to-be-discharged position of the cleaning liquid from the cleaning-liquid nozzle 71 and an interface on a side of a to-be-discharged position of the cleaning-liquid in a to-be-discharged position of the gas from the gas nozzle 5 is set between 9 mm and 15 mm, similarly to the first embodiment. A distance d2 between a center P1 of the discharge opening 50 of the gas nozzle 5 and a center P2 of the discharge opening 72a of the second cleaning-liquid nozzle 72 in a moving direction of the respective nozzles 71, 72, and 5 is set at, e.g., 17.9 mm. A distance d3 between the center P1 and the center P2 in a direction perpendicular to the moving direction of the respective nozzles is set at, e.g., 15 mm. In order that the cleaning liquid R and an $N_2$ gas G are respectively discharged to a central part of the wafer W, the cleaning-liquid nozzle 71 and the gas nozzle 5 are arranged side by side in the moving direction of the respective nozzles. An angle θ defined by the moving direction of the respective nozzles and a direction in which the gas nozzle 5 and the second cleaning-liquid nozzle 72 are arranged is, e.g., 40°. Although the layout of the respective nozzles is not limited to this example, the respective nozzles should be arranged such that, when the cleaning liquid R is supplied from the second cleaning-liquid nozzle 72 at an outer edge position of the dried area 6, a distance between the to-be-supplied position of the cleaning liquid from the second cleaning-liquid nozzle 72 and the central part of the wafer W is shorter than a distance between the central part of the wafer W and the gas nozzle 5, which is described below. The meaning of "the distance between the central part of the wafer W (substrate) and the to-be-discharged position of the cleaning liquid R from the second cleaning-liquid nozzle 72 is shorter than the distance between the central part C of the wafer W and a projection position of the gas nozzle 5 onto the wafer W" includes a case in which these distances are the same. Namely, the positions of the second cleaning-liquid nozzle 72 and the gas nozzle 5 are determined in such a manner that liquid droplets falling from the gas nozzle 5 can be removed by the cleaning liquid R supplied from the second cleaning-liquid nozzle 72.

Next, the respective steps of a cleaning process with the use of this development apparatus 70 are described with reference to FIGS. 13A to 13F and FIGS. 14A to 14F. FIGS. 13A to 13F show movements of the respective cleaning-liquid nozzles 71 and 72 and the gas nozzle 5 and a spreading of the dried area 6. FIGS. 14A to 14F show stepwise states in which the cleaning liquid R and the gas G are discharged from the respective nozzles. Chain lines in FIGS. 13A to 13F depict a diameter of the wafer W, and chain lines in FIGS. 14A to 14F depict a central rotation axis of the wafer W.

Step S1: After a developer has been supplied similarly to the first embodiment, as shown in FIG. 13A, the first cleaning-liquid nozzle 71 is set to be opposed to the central part C of the wafer W, at a 15-mm high position, for example, from a surface of the wafer W. With the spin chuck 2 being rotated at a rotation speed of, e.g., 1000 rpm, the cleaning liquid R is discharged at a flow rate of, e.g., 250 ml/minutes, for e.g., 5 seconds, from the cleaning-liquid nozzle 71 to the central part C of the wafer W (FIG. 14A). Then, the cleaning liquid R is spread by the centrifugal force from the central part C of the wafer W toward a periphery thereof, so that the developer is cleaned by the cleaning liquid R.

Step S2: Then, as shown in FIG. 13B, while the spin chuck 2 is being rotated at a rotation number of 1500 rpm or more, e.g., 2000 rpm, the cleaning-liquid nozzle 71 is slightly moved outward from the central part C of the wafer W, and the cleaning-liquid nozzle 72 is moved toward the central part of the wafer W, so that the gas nozzle 5 is positioned to be opposed to the central part C of the wafer W. At this time, the first cleaning-liquid nozzle 71 is moved at a speed of, e.g., 150 mm/second, while the cleaning-liquid nozzle 71 is discharging the cleaning liquid R at a flow rate of, e.g., 250 ml/minute. Immediately after the gas nozzle 5 has been opposed to the central part C of the wafer W, the gas nozzle 5 starts to eject a gas, for example an inert gas such as an $N_2$ gas G, to the central part C. Thus, similarly to the first embodiment, a dried area 6 is formed. The dried area 6 is spread up to a position onto which the cleaning liquid R is discharged from the first cleaning-liquid nozzle 71 (FIG. 13B).

Step S3: After 0.5 seconds, for example, has passed from the start of the discharge of the gas, the discharge of the gas is stopped. Substantially simultaneously therewith, the discharge of the cleaning liquid R from the first cleaning-liquid nozzle 71 is stopped. Following thereto, as shown in FIG. 13C, the first cleaning-liquid nozzle 71 and the gas nozzle 5 are moved toward the periphery of the wafer W, and the second cleaning-liquid nozzle 72 is moved to a position above the diameter of the wafer W which is perpendicular to the nozzle moving direction (FIG. 14C). A moving speed of the nozzles at this time is e.g., 150 mm/second, such that, when the to-be-discharged position of the cleaning liquid R from the second cleaning-liquid nozzle 72 is positioned at the position above the diameter of the wafer W (FIG. 14D), the cleaning liquid can be supplied from the second cleaning-liquid nozzle 72 to the outer edge position of the dried area 6 that is spread around the central part of the wafer W.

Step S4: As shown in FIGS. 13D and 14D, the respective nozzles are continuously moved so that, when the to-be-discharged position of the cleaning liquid R from the second cleaning-liquid nozzle 72 is positioned at the position above the diameter of the wafer W, the cleaning liquid R is discharged at a flow rate of, e.g., 250 ml/second from the cleaning-liquid nozzle 72 to the wafer W just at the outer edge position of the dried area 6 (FIG. 14D). Herein, the "outer edge position of the dried area" includes positions inside and outside the outer edge position by several millimeters such as 2 millimeters, as long as they do not affect the cleaning effect. For example, the to-be-discharged position of the cleaning liquid may be slightly deviated from the outer edge position of the dried area based on a timing of the operation of the nozzle driving mechanism and a timing of the spreading of the dried area.

Figure 15:
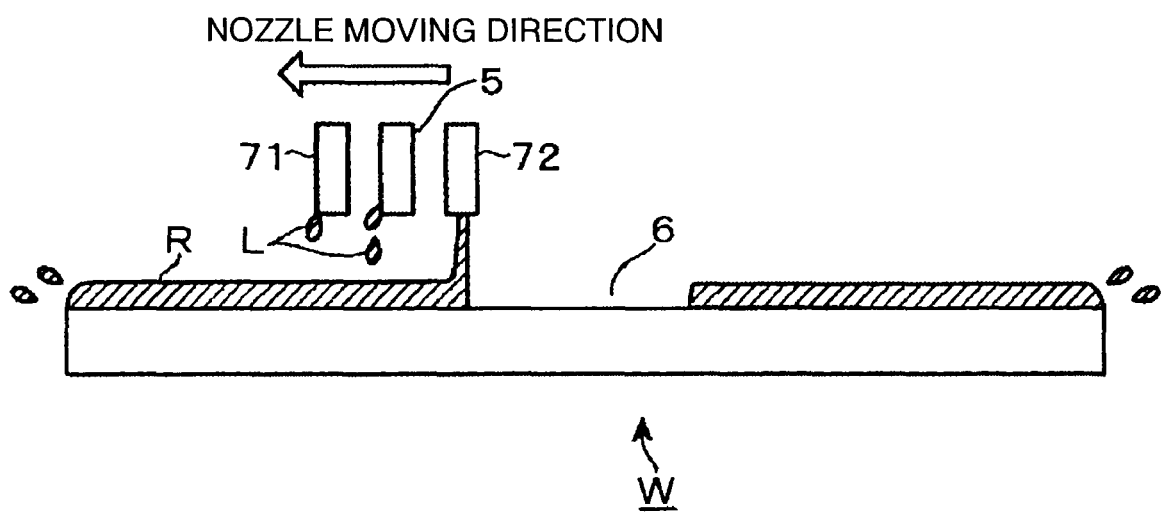
FIG. 15 is a side view of the wafer and the nozzles that are moving above the wafer in the third embodiment.

Step S5: As shown in FIGS. 13E and 14E, the cleaning-liquid nozzles 71 and 72 and the gas nozzle 5 are continuously moved toward the periphery of the wafer W at a speed of, e.g., 5 mm/second, which is lower than a speed at which the dried area 6 is spread outward. As shown in FIG. 15, during the movement of the respective nozzles, liquid droplets L are formed on the cleaning-liquid nozzle 71 and on the gas nozzle 5. Even when the liquid droplet L falls onto the wafer W, since the cleaning-liquid nozzle 71 and the gas nozzle 5 are moved in an area outside the dried area 6, the droplet L that has fallen onto the wafer W can be cleaned by the cleaning liquid R supplied from the cleaning-liquid nozzle 72. Thus, it can be restrained that the liquid droplet L enters a recess formed in the surface of the wafer W and remains therein resulting in a development fault.

Step S6: When the to-be-discharged position of the cleaning liquid from the second cleaning-liquid nozzle 72 reaches a position slightly distant from the periphery of the wafer W toward the center thereof, e.g., a position distant from the periphery of the wafer W by 2 to 10 mm toward the center thereof (FIG. 13F), the discharge of the cleaning liquid R from the second cleaning-liquid nozzle 72 is stopped (FIG. 14F). Then, the wafer is continuously rotated at the same rotation number (in this example, a rotation number of 2000 rpm), so that the dried area 6 is spread outside. After the dried area 6 has been spread to reach the periphery of the wafer W, the rotation number of the wafer W is continuously set at 2000 rpm, so that liquid droplets on the wafer W are completely spun off by the centrifugal force so as to dry the wafer W. The cleaning-liquid nozzle 4 and the gas nozzle 5 are returned to their waiting positions.

Also in the third embodiment, the cleaning process is performed as follows. After the cleaning liquid R has been supplied to the central part C of the wafer W, the to-be-supplied position of the cleaning liquid R is moved from the central part C to an eccentric position, and the $N_2$ gas is ejected to the central part C of the wafer W to thereby form the dried area 6, under the conditions in which the distance between the interface on the side of the cleaning-liquid to-be-discharged position of the gas to-be-discharged position and the interface on the side of the gas to-be-discharged position of the cleaning-liquid to-be-discharged position is set between 9 mm and 15 mm. Thereafter, while the wafer W is being rotated, the to-be-supplied position of the cleaning liquid R is moved toward the periphery of the wafer W at a speed lower than a speed at which the dried area 6 is spread outward. Thus, similarly to the first embodiment, a high cleaning effect can be produced. In addition, when the cleaning liquid is supplied from the second cleaning-liquid nozzle 72 after the dried area 6 has been formed, the first cleaning-liquid nozzle 71 and the gas nozzle 5 are moved in an area outside the outer edge of the dried area 6, a development fault can be restrained from occurring, which might be caused by the liquid droplets falling from these nozzles.

[Fourth Embodiment]

A fourth embodiment of the cleaning method is performed by an apparatus which is the same as the apparatus used in the first embodiment. A cleaning-liquid nozzle 4 and a gas nozzle 5 are integrally moved. Movements of the cleaning-liquid gas nozzle 4 and the gas nozzle 5 are described with reference to FIG. 16. As a matter of convenience, a right and left direction in the drawings, which is a moving direction of the respective nozzles, is referred to as an X direction. A side on which the cleaning-liquid nozzle 4 is positioned (left side in FIG. 16) and a side on which the gas nozzle 5 is positioned (right side in FIG. 16) are referred to as a +X side and a −X side, respectively.

Figure 16A:
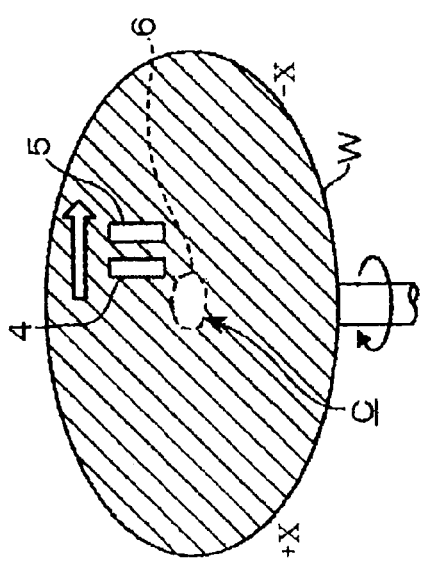
FIGS. 16A to 16E are explanatory views showing stepwise states in which a developed wafer is cleaned by using a substrate cleaning apparatus in a fourth embodiment according to the present invention.
Figure 16B:
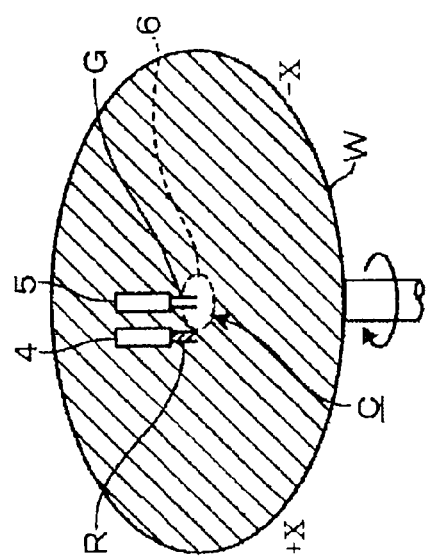
Figure 16C:
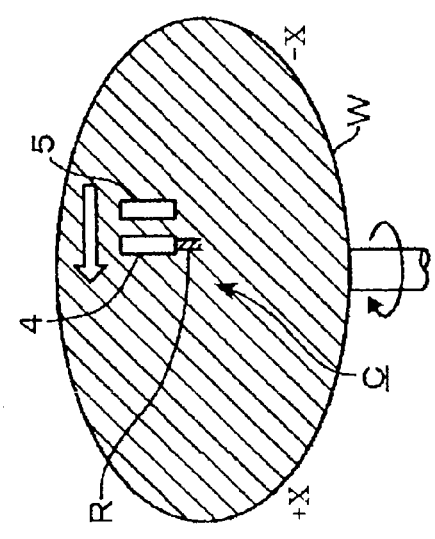

After a developer has been supplied similarly to the first embodiment, a cleaning liquid R is discharged from the cleaning-liquid nozzle 4 to a central part C of a wafer W (FIG. 16A). While the cleaning liquid R is being discharged, the cleaning-liquid nozzle 4 and the gas nozzle 5 are moved in the +X direction, so that the gas nozzles 5 is positioned to be opposed to the central part C of the wafer W. Then, an $N_2$ gas G is supplied from the gas nozzle 5 to the central part C so that a dried area 6 is formed (FIG. 16B). After a predetermined time has passed from the start of the discharge of the gas, the supply of the $N_2$ gas G and the supply of the cleaning liquid R are stopped. Then, the cleaning-liquid nozzle 4 and the gas nozzle 5 are moved in the −X direction at a speed faster than a speed at which the dried area 6 is spread on the wafer W (FIG. 16C). A moving speed of the nozzles 4 and 5 is, e.g., 150 mm/second.

Figure 16D:
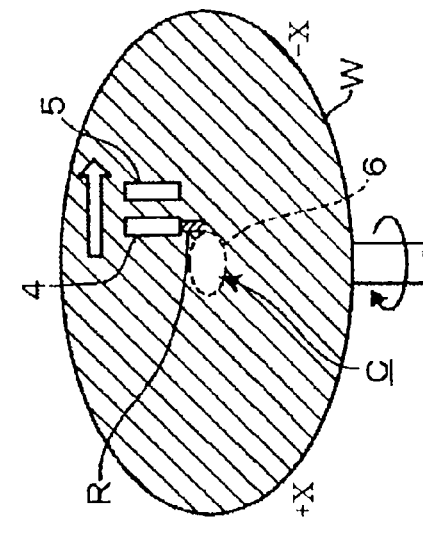
Figure 16E:
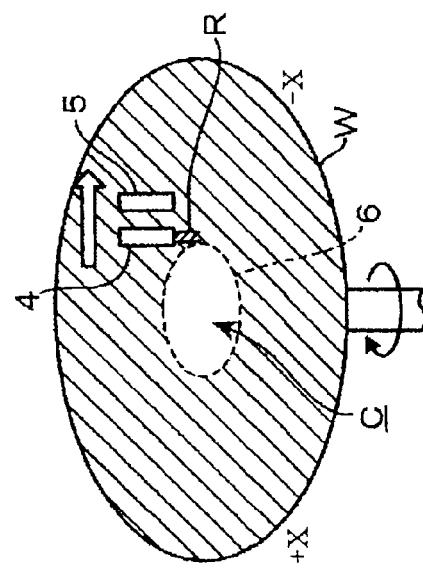

Then, after the cleaning-liquid nozzle 4 has passed a position above the central part C of the wafer W, when the cleaning-liquid nozzle 4 reaches the aforementioned outer edge position of the dried area 6, the cleaning-liquid nozzle 4 restarts the discharge of the cleaning liquid R (FIG. 16D). Thereafter, with the cleaning liquid R being discharged from the cleaning-liquid nozzle 4, the cleaning-liquid nozzle 4 and the gas nozzle 5 are moved in the −X direction at a speed of, e.g., 5 mm/second, which is lower than the speed at which the dried area 6 is spread outward. In accordance with the movement of the cleaning-liquid nozzle 4, the dried area 6 is spread outward (FIG. 16E). After that, when the cleaning-liquid nozzle 4 is moved to reach a position in a vicinity of the periphery of the wafer W, the discharge of the cleaning liquid R is stopped, and the wafer W is dried in the same manner as the step 4 of the first embodiment.

Also in the fourth embodiment, the same effect as that of the first embodiment can be produced because of the same nozzle arrangement as that of the first embodiment. In addition, in the fourth embodiment, after the $N_2$ gas has been discharged, the gas nozzle 5 is positioned in an area outside the dried area 6, so that the gas nozzle 5 is moved outside the dried area 6 while the cleaning-liquid nozzle 4 discharging the cleaning liquid is moved toward the periphery of the wafer W. Thus, even when a liquid droplet falls from the gas nozzle 5 onto the wafer W, it can be restrained that the liquid droplet falls down to a position within the dried area. Thus, it is possible to more reliably restrain occurrence of a development fault. In the fourth embodiment, since the nozzles 4 and 5 pass above the dried area 6 after the dried area 6 has been formed, there is a possibility that liquid droplets might adhere to the respective nozzles and the liquid droplets might fall down to a position within the dried area 6. However, since a moving distance of the respective nozzles 4 and 5 above the dried area 6 remaining on the central part of the wafer W is small, it can be said that falling down of the liquid droplet to the dried area 6 can be more restrained as compared with the first embodiment. However, the third embodiment is more preferable because a development fault caused by the liquid droplet can be more reliably restrained.

Figure 17A:
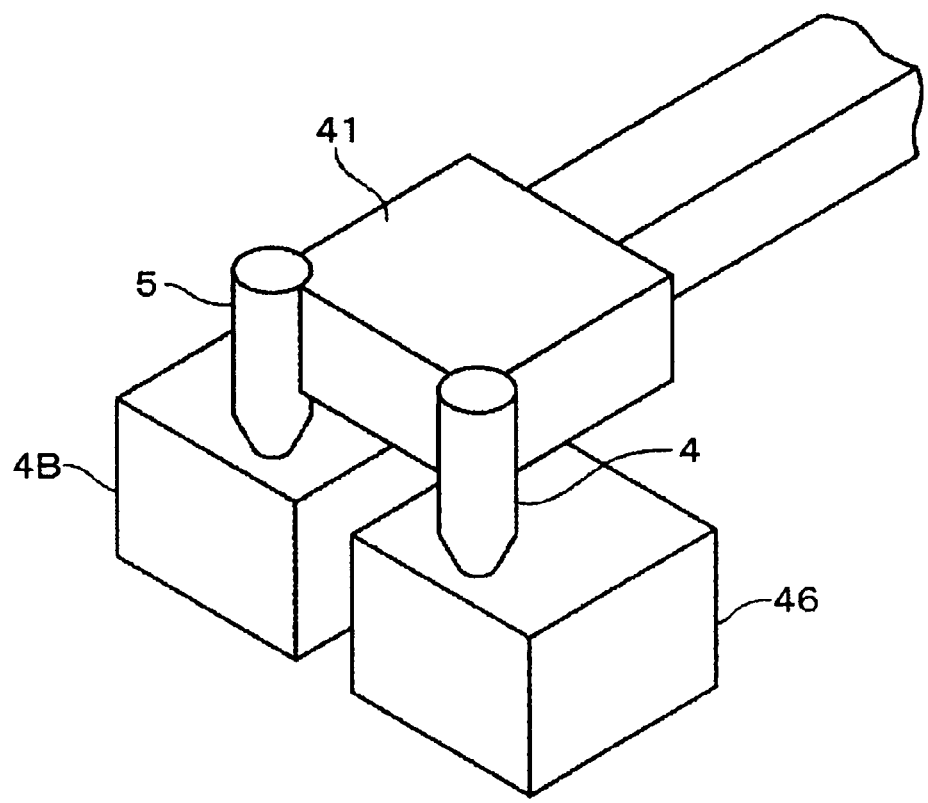
FIGS. 17A and 17B are schematic views for explaining waiting regions of nozzles.
Figure 17B:
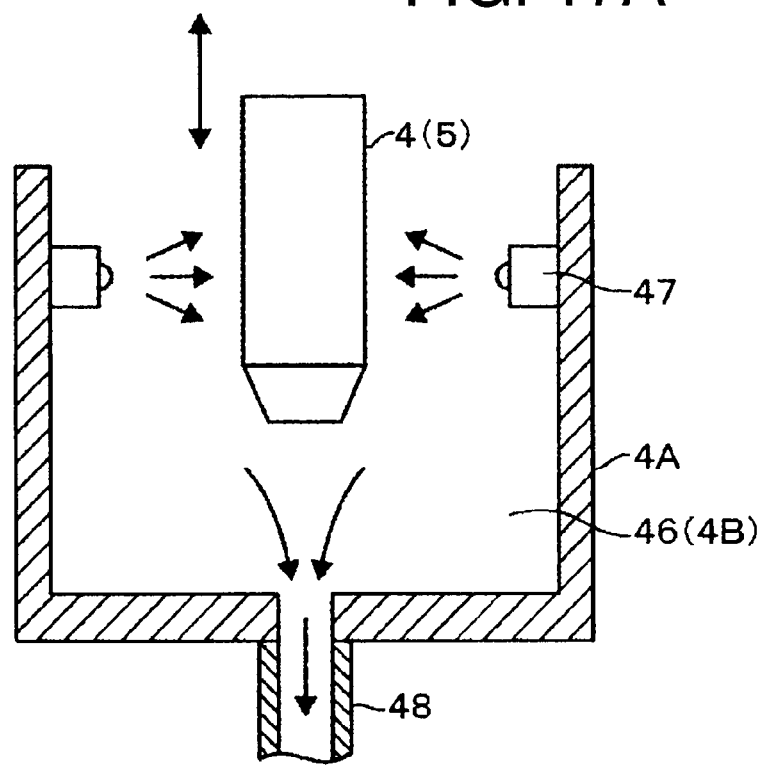

In the fourth embodiment, in order to restrain falling down of the liquid droplet during the movement of the nozzles, waiting regions of the nozzles may be structured as shown in FIGS. 17A and 17B. In this example, a waiting region 46 is constituted as a space inside a container 4A having an opened upper side. Disposed inside the container 4A are a dry nozzle 47 for drying the gas nozzle 4 by blowing a dry gas onto the gas nozzle 4 in a waiting state, and an exhaust pipe 48 through which the dry gas supplied into the waiting region 46 is discharged. Due to this structure of the waiting region 46, when the cleaning-liquid nozzle 4 is waiting in the waiting region 46 after one wafer W has been cleaned and dried, the nozzle 4 can be dried. Thus, when a succeeding wafer W is processed, falling down of a liquid droplet from the cleaning-liquid nozzle 4 to the dried area 6 can be restrained. In the drawings, the reference number 4B depicts a waiting region for the gas nozzle 5 disposed in adjacent to the waiting region 46. The waiting region 4B has the same structure as that of the waiting region 46, and thus the gas nozzle 5, which is waiting, can be dried. In the other embodiments, these waiting regions 46 and 4B may be provided. In addition, the waiting regions 46 and 4A may be equipped with heaters instead of the dry nozzles 47, so that the cleaning-liquid nozzle 4 and the gas nozzle 5 are dried by heats from the heaters.

[Fifth Embodiment]

Figure 18A:
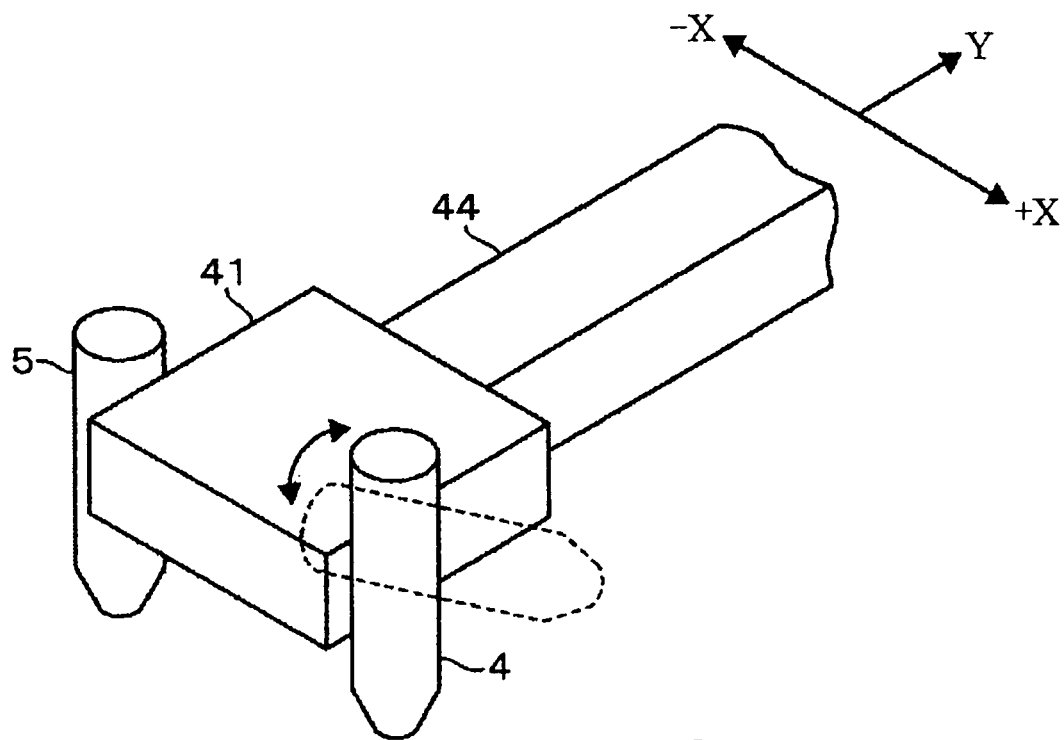
FIGS. 18A and 18B are schematic views showing nozzles and waiting regions thereof in a substrate cleaning apparatus in a fifth embodiment according to the present invention.
Figure 18B:
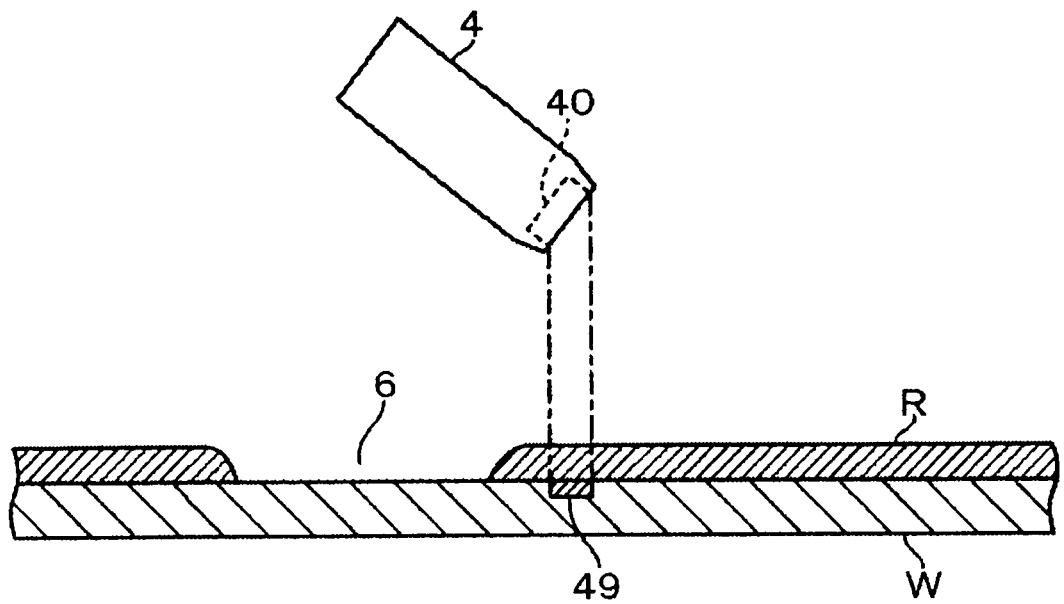

Next, there is described a fifth embodiment which is a modification of the fourth embodiment. A cleaning process in this embodiment is performed by using an apparatus having substantially the same structure as that of the development apparatus of the first embodiment. However, as shown in FIGS. 18A and 18B, a cleaning-liquid nozzle 4 is configured to be capable of being inclined, about an axis extending in an X direction, in a Y direction that is perpendicular to the X direction in a horizontal plane.

Figure 19A:
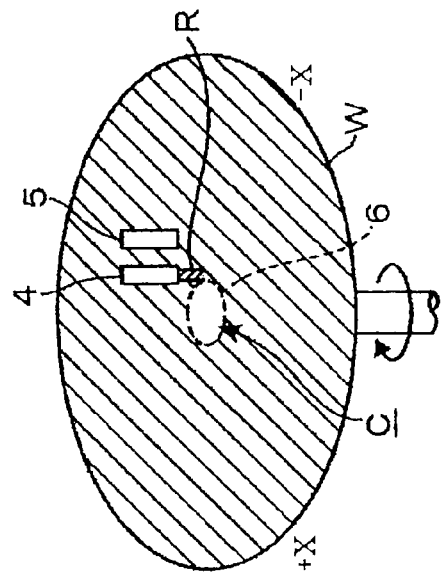
FIGS. 19A to 19C are explanatory views showing stepwise states in which a developed wafer is cleaned by using the substrate cleaning apparatus in the fifth embodiment.
Figure 19B:
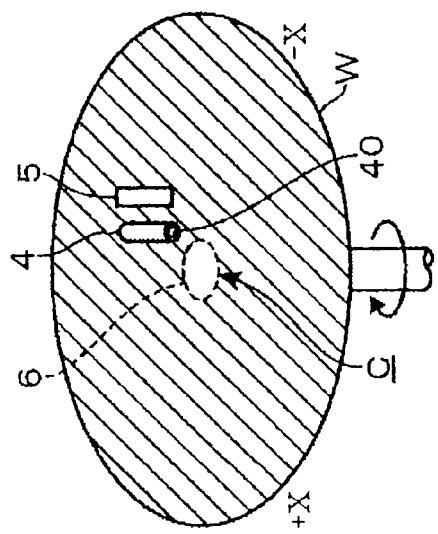
Figure 19C:
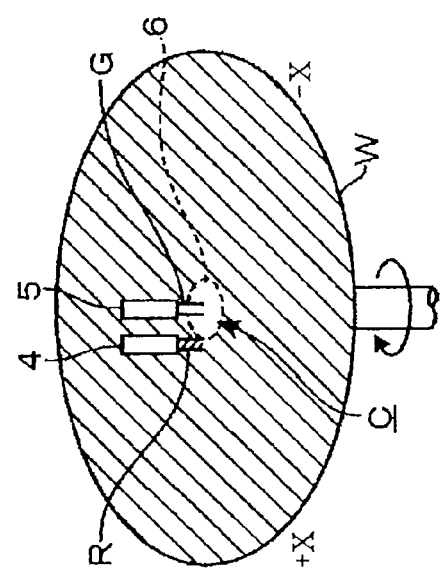

Next, a cleaning method in the fifth embodiment is described with reference to FIGS. 19A to 19C. After a developer has been supplied to a wafer W similarly to the fourth embodiment, a cleaning liquid R is discharged to a central part C of the wafer W from the cleaning-liquid nozzle 4 whose discharge direction of the cleaning liquid has been oriented vertically downward. Subsequently, with the cleaning liquid R being discharged, the cleaning-liquid nozzle 4 and a gas nozzle are moved in a +X direction, so that the gas nozzle 5 is positioned to be opposed to the central part C of the wafer W. Then, an $N_2$ gas G is supplied so that a dried area 6 is formed on the central part C of the wafer W (FIG. 19A).

Thereafter, the supply of the $N_2$ gas G and the supply of the cleaning liquid R are stopped. Then, as shown in FIG. 18B, the cleaning-liquid nozzle 4 is inclined in the Y direction in such a manner that a projection area 49 of a discharge opening 40 of the cleaning-liquid nozzle 4 onto the wafer W is not positioned within the dried area 6. Thereafter, similarly to the fourth embodiment, the cleaning-liquid nozzle 4 and the gas nozzle 5 are moved in a −X direction at a speed lower than a speed at which the dried area 6 is spread on the wafer W (FIG. 19B).

Then, after the cleaning-liquid nozzle 4 has passed through a position above the central part C of the wafer W, when the cleaning-liquid nozzle 4 reaches a position slightly outside an outer edge of the dried area 6, for example, the inclination of the cleaning-liquid nozzle 4 is changed so as to supply the cleaning liquid vertically downward. Subsequently, the discharge of the cleaning liquid is restarted such that the cleaning liquid R is supplied to the outer edge position of the dried area 6 (FIG. 19C). After that, similarly to the fourth embodiment, with the cleaning liquid R being discharged from the cleaning-liquid nozzle 4, the cleaning-liquid nozzle 4 and the gas nozzle 5 are moved in the −X direction at a speed of, e.g., 5 mm/second which is lower than the speed at which the dried area 6 is spread. When the cleaning-liquid nozzle 4 is moved to a position in a vicinity of the peripheral part of the wafer W, the wafer W is dried in the same manner as the step 4 of the first embodiment.

The fifth embodiment can produce the same effect as that of the fourth embodiment. Further, when the gas nozzle 5 is positioned outside the dried area 6 after the dried area 6 has been formed, the cleaning-liquid nozzle 4 is inclined such that the projection area of the discharge opening 40 is oriented outward the dried area 6. Thus, liquid droplets L can be restrained from falling down from the cleaning-liquid nozzle 4 to a position within the dried area 6. In addition, it is possible to change an inclination of the gas nozzle 5 similarly to the cleaning-liquid nozzle 4, when the gas nozzle 5 is moved above the dried area 6, so as to prevent falling down of the liquid droplets L from the gas nozzle 5 to a position within the dried area 6.

[Sixth Embodiment]

Figure 20A:
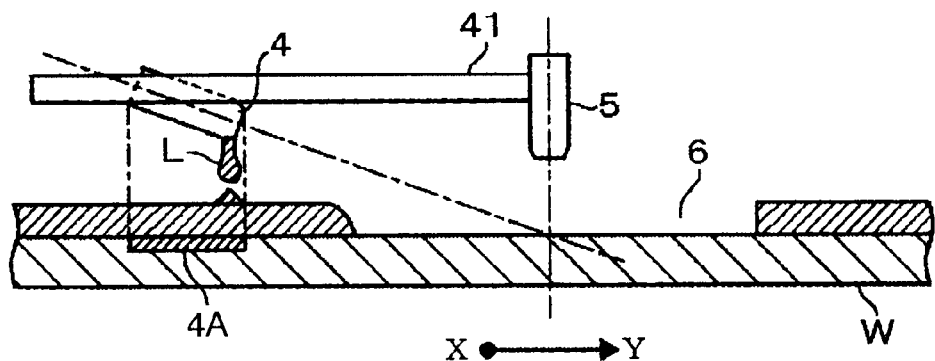
FIGS. 20A to 20C are structural views showing nozzles of a substrate cleaning apparatus in a sixth embodiment according to the present invention.
Figure 20B:
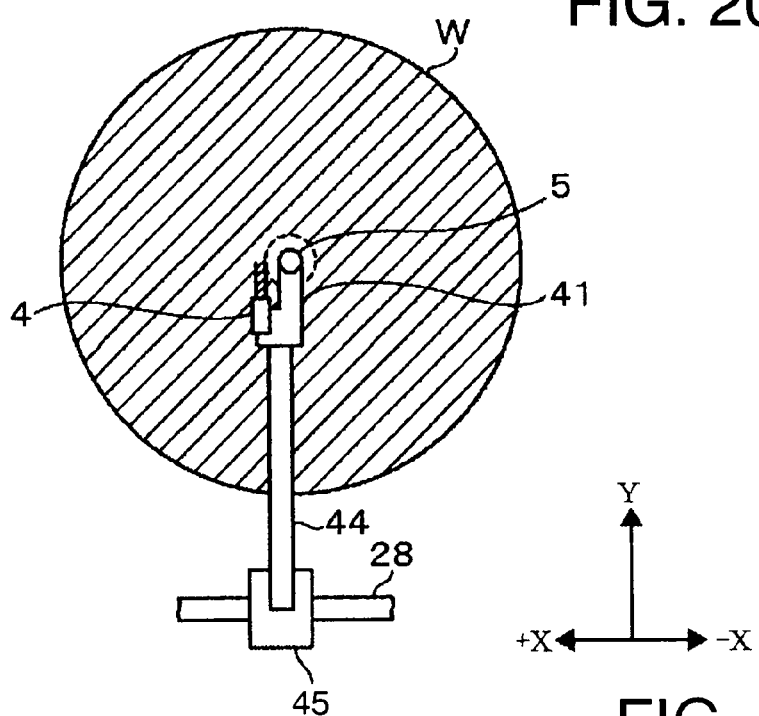
Figure 20C:
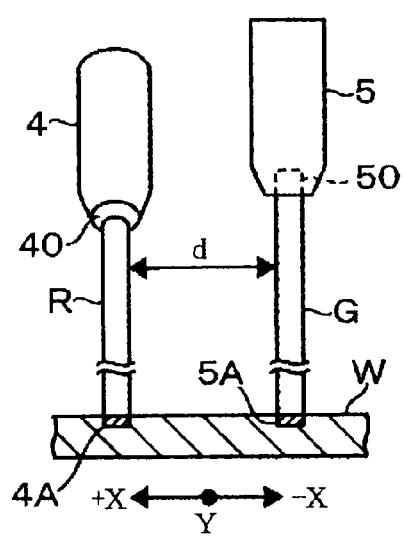

Next, there is described a sixth embodiment which is another modification of the fourth embodiment. Although a development apparatus used in the sixth embodiment has substantially the same structure as that of the apparatus of the first embodiment, a cleaning-liquid nozzle 4 is disposed on a nozzle holder 41 in an inclined manner as shown in FIGS. 20A and 20B. However, similarly to the other embodiments, a to-be-supplied position of a cleaning liquid R is moved above the wafer W by a movement of the cleaning-liquid nozzle 4. As shown in FIG. 20C, a distance d between an interface on a side of a to-be-discharged position of the gas in a to-be-discharged position of the cleaning liquid and an interface on a side of the to-be-discharged position of the cleaning liquid in the to-be-discharged position of the gas is set to be the same as that of the aforementioned respective embodiments.

The purpose of the inclined disposition (arrangement) of the cleaning-liquid nozzle 4 is as follows. After a cleaning process has been performed in the same procedure as that of the fourth embodiment so as to form a dried area 6, the cleaning-liquid nozzle 4 and a gas nozzle 5 are moved in an −X direction. At this time, a projection area 4A of the cleaning-liquid nozzle 4 onto a surface of the wafer W is moved in an area outside the dried area 6. Thus, as shown in FIG. 20A, even when liquid droplets L fall from the cleaning-liquid nozzle 4, the liquid droplets L fall on a position outside the dried area 6. An angle of the cleaning-liquid nozzle 4 relative to a horizontal axis and a distance in a Y-axis direction between the cleaning-liquid nozzle 4 and the gas nozzle 5 are suitably designed in consideration of a speed at which the dried area 6 is spread outward and a speed at which the respective nozzles 4 and 5 are moved in the −X direction.

Figure 21A:
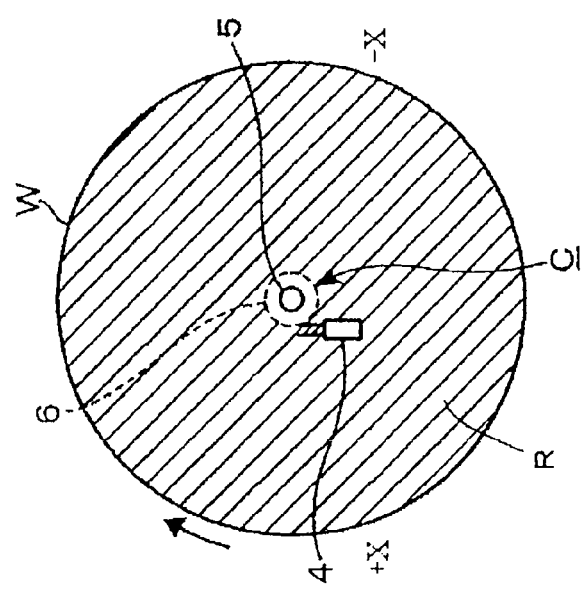
FIGS. 21A to 21C are explanatory views showing stepwise states in which a developed wafer is cleaned by using the substrate cleaning apparatus in the sixth embodiment.
Figure 21B:
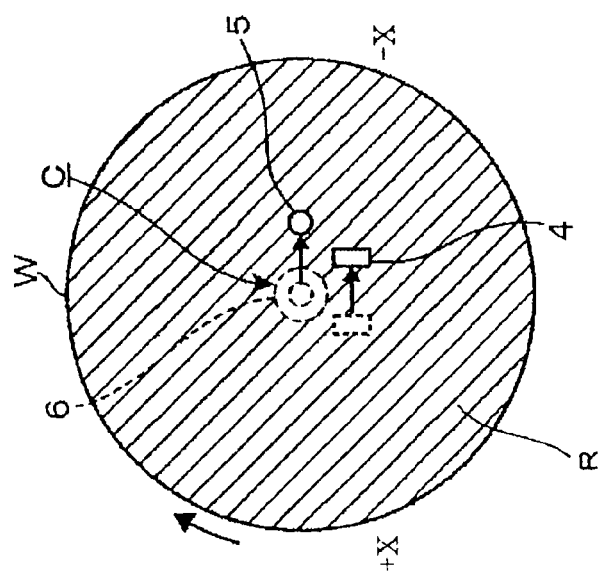
Figure 21C:
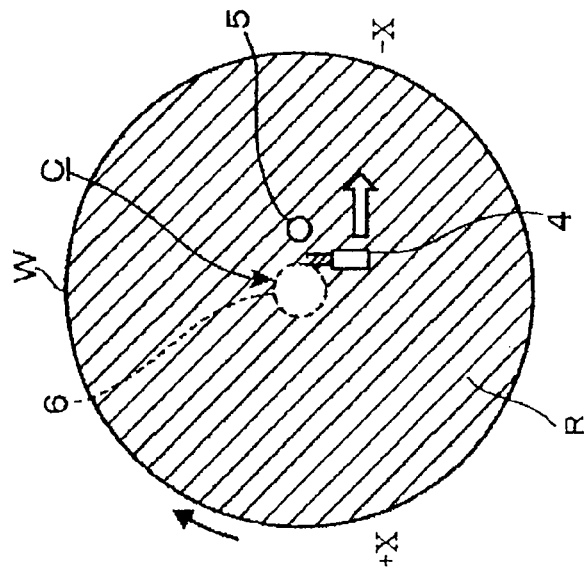

The cleaning step of the sixth embodiment is performed similarly to the cleaning step of the fourth embodiment. After an N$_2$ gas G has been supplied from the gas nozzle 5 so as to form the dried area 6 on a central part C of the wafer W (FIG. 21A), the supply of the N$_2$ gas G and the supply of the cleaning liquid R are stopped, and the cleaning-liquid nozzle 4 and the gas nozzle 5 are moved in the −X direction at a speed faster than a speed at which the dried area 6 is spread on the wafer W (FIG. 21B). Thereafter, similarly to the fourth embodiment, after the cleaning-liquid nozzle 4 has passed a position above the central part C of the wafer W, when the cleaning-liquid nozzle 4 reaches a position slightly outside the dried area 6, the cleaning liquid R is discharged again toward the wafer W (FIG. 21C). After that, the cleaning-liquid nozzle 4 is moved toward a periphery of the wafer W.

When the cleaning process is performed as described above, falling down of liquid droplets L from the cleaning-liquid nozzle 4 to a position within the dried area 6 can be restrained, while the respective nozzles 4 and 5 are moved above the dried area 6, after the dried area 6 has been formed, until the cleaning liquid R is supplied again. In addition, after the cleaning liquid has been discharged again, the gas nozzle 5 is moved outside the dried area 6. Thus, falling down of liquid droplets L from the gas nozzle 5 to a position within the dried area 6 can be restrained.

In the second to sixth embodiments, the rotation speed of the wafer W may be controlled in accordance with a to-be-supplied position of the cleaning liquid, similarly to the first embodiment. In addition, operations of the respective members of the development apparatuses in the respective embodiments are controlled based on control signals sent from the control part 7 so as to perform the aforementioned respective cleaning steps.

The substrate cleaning apparatus of the present invention can be suitably used for cleaning a developed substrate to which a highly water-repellent resist has been applied, in a pattern forming system that performs an immersion exposure process. However, the substrate cleaning apparatus of the present invention may be used for cleaning a substrate which is not yet subjected to an immersion exposure process or a substrate which has been subjected to an immersion exposure process but is not yet developed. To be specific, there may be a case in which a substrate is cleaned before an immersion exposure process, wherein the substrate has a highly water-repellent protective film formed on a resist of the substrate, or wherein a highly water-repellent resist has been applied to the substrate without any protective film. In addition, there may be a case in which a protective film is removed by a chemical liquid after an immersion exposure process and the chemical liquid is cleaned, and a case in which liquid droplets on a substrate to which a highly water-repellent resist has been applied without forming any protective film are removed after an immersion exposure process.

Figure 22:
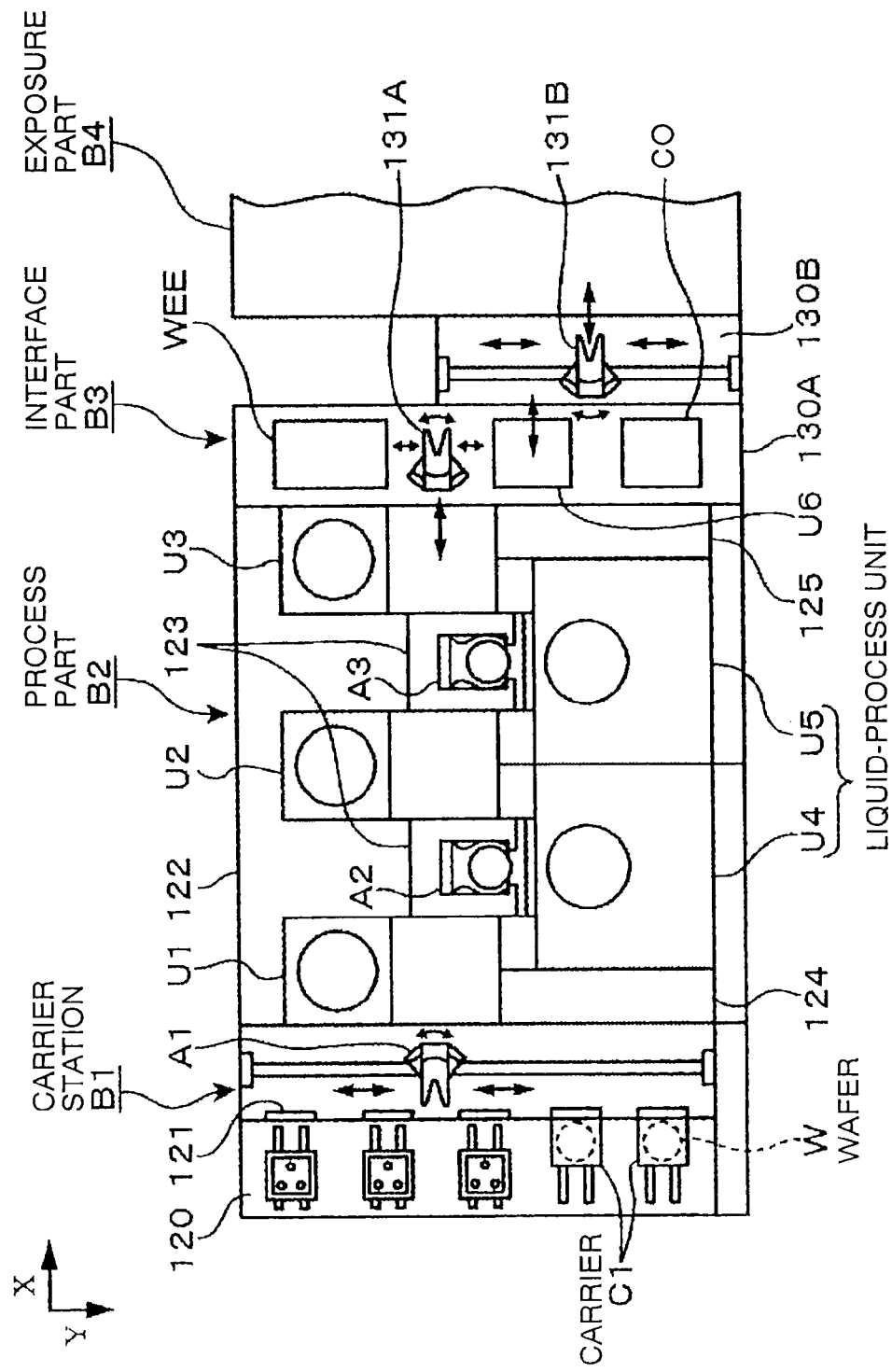
FIG. 22 is a plan view showing an example of an application and development apparatus in which the development apparatus is incorporated.
Figure 23:
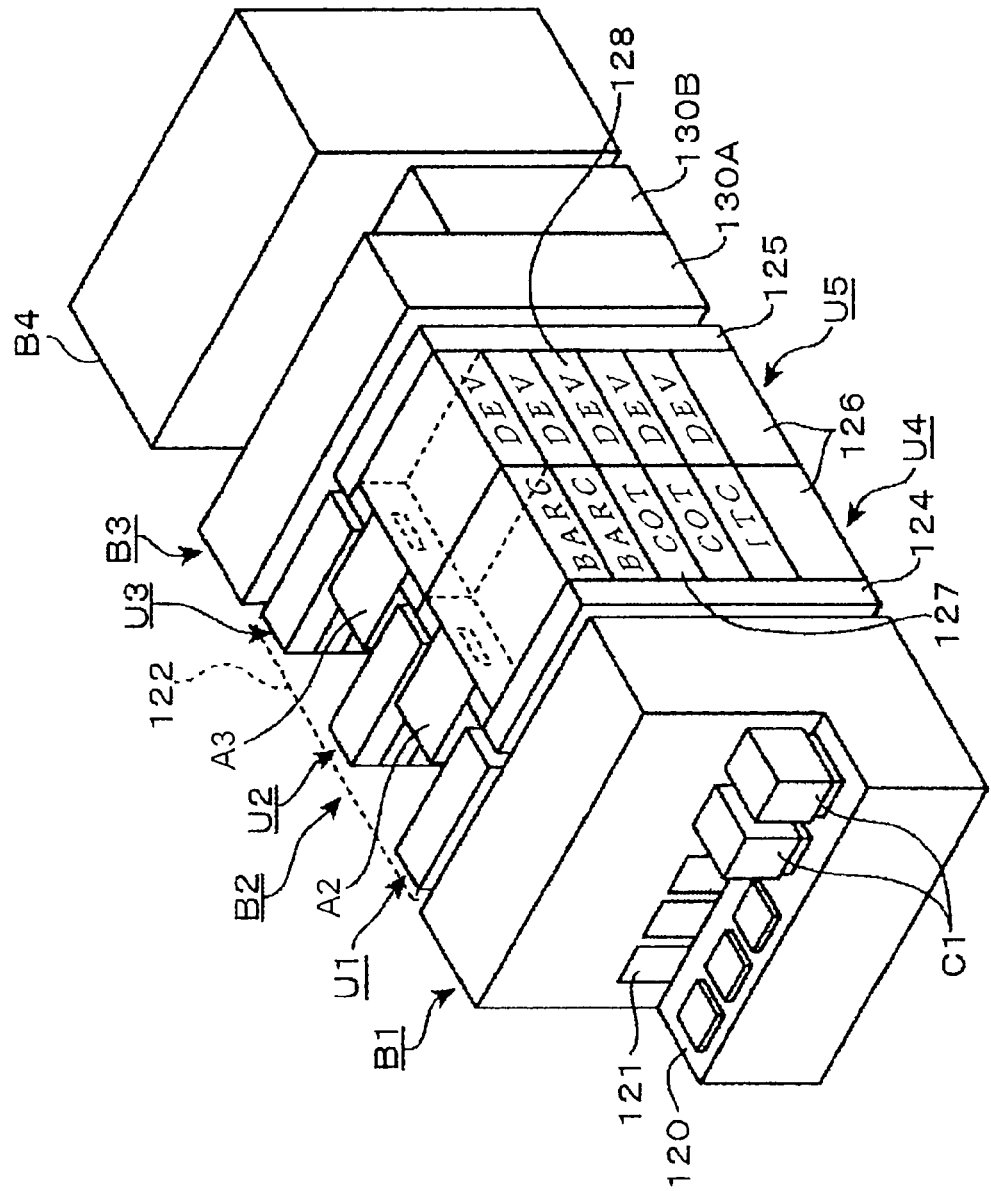
FIG. 23 is a perspective view showing the application and development apparatus shown in FIG. 22 in which the development apparatus is incorporated.

Herebelow, there is briefly described an example in which the cleaning apparatus of the present invention is applied to a pattern forming system that performs an immersion exposure process, with reference to FIGS. 22 and 23. In this system, an exposure apparatus is connected to an application and development apparatus. In the drawings, the reference number B1 depicts a carrier station provided with a stage 120, through which a carrier C1 hermetically containing a plurality of, e.g., 13 wafers W is loaded and unloaded. An opening and closing part 121 is formed in a wall surface which is forward of the carrier station B1 when seen therefrom. There is provided a transport member A1 that takes the wafers W from the carrier C1 via the opening and closing part 121.

A process part B2 whose circumference is surrounded by a housing 122 is connected to a rear side of the carrier station B1. In the process part B2, there are alternately disposed, shelf units U1, U2, and U3, and main transfer members A2 and A3 which are arranged between the respective shelf units, in that order from the front side. The shelf units U1, U2, and U3 have units of heating and cooling systems that are arranged at a plurality of levels. As shown in FIG. 22, there are further disposed liquid-process units U4 and U5. The main transfer members A2 and A3 are placed in a space surrounded by a partition wall 123 composed of: opposed wall surfaces facing the shelf units U1, U2, and U3, which are arranged in a fore and aft direction when seen from the carrier station B1; a wall surface facing the liquid-process units U4 and U5; and a wall surface opposed to the latter wall surface. The reference numbers 124 and 125 depict temperature and humidity adjusting units, each having a device for adjusting a temperature and/or a humidity of a process liquid used in the respective units, and/or a duct for adjusting a temperature and/or a humidity.

As shown in FIG. 23, for example, the liquid-process units U4 and U5 are constituted by laying, on chemical-liquid containers 126, an application unit (COT) 127, a development unit (DEV) 128, an anti-reflection film forming unit (BARC), and so on, at a plurality of, e.g., 5 levels. The development unit (DEV) 128 also serves as the cleaning apparatus in the first embodiment. The above-described shelf units U1, U2, and U3 are constituted by laying various units for performing a pre-process and/or a post-process for a process performed by the liquid-process units U4 and U5 at a plurality of, e.g., 10 levels. A heating unit for heating (baking) a wafer W and a cooling unit for cooling a wafer W are included in a combination of the various units.

An exposure part B4 is connected via an interface part B3 to a rear side of the shelf unit U3 in the process part B2. As shown in FIG. 22 in detail, the interface part B3 is composed of a first transfer chamber 130A and a second transfer chamber 130B which are arranged between the process part B2 and the exposure part B4 in the fore and aft direction. The first transfer chamber 130A and the second transfer chamber 130B are provided with a first substrate transfer member 131A and a second substrate transfer member 131B, respectively. In the first transfer chamber 130A, there are disposed a shelf unit U6, a buffer cassette CO, and the substrate cleaning apparatus of the present invention. The shelf unit U6 is constituted by laying a heating unit (PEB) for PEB-processing an exposed wafer W, a high-precision temperature adjusting unit having a cooling plate, and so on, in an up and down direction.

A process flow of a wafer W in the aforementioned system is briefly described. At first, when the carrier C1 containing wafers W is loaded from outside and placed on the stage 120, the opening and closing part 121 and a lid member of the carrier C1 are opened, and the wafers W are taken out by the transport member A1. The wafers W are transported to the main transfer member A2 via a transport unit as one of the shelves (levels) of the shelf unit U1, and the wafers W are subjected to a hydrophobing process and a substrate-temperature adjusting process performed by the cooling unit in a certain shelve of the shelf units U1 and U2.

Thereafter, the wafers W are loaded into the application unit (COT) 127 by the main transfer member A2, and resist films are deposited on surfaces of the respective wafers W. After that, the wafers W are unloaded outside by the main transfer member A2, and are loaded into the heating unit. In the heating unit, the wafers W are subjected to a baking process at a predetermined temperature.

After the wafers W have been subjected to the baking process, the wafers W are cooled by the cooling unit. Then, the wafers W are loaded into the interface part B3 via the transport unit of the shelf unit U3, and are then loaded into the exposure part B4 via the interface part B3. When a protective film for the immersion exposure is applied on a resist film, a chemical liquid for forming the protective film is applied by a unit (ITC) in the process part B2, after the wafers W have been cooled by the cooling unit. Subsequently, the wafers W are loaded into the exposure part B4, and subjected to an immersion exposure process. In this case, the wafers W may be cleaned before the immersion exposure process, by the cleaning apparatus of the present invention, not shown, provided in the interface part B3.

After that, after the wafers W have been subjected to the immersion exposure process, the wafers W are taken out from the exposure part B4 by the second substrate transfer member 131B. Following thereto, liquid droplets on the surfaces of the substrates are removed by the substrate cleaning apparatus of the present invention. Then, the wafers W are loaded into the heating unit (PEB) which is one of the shelves (levels) of the shelf unit U6.

Thereafter, the wafers W are unloaded from the heating unit by the substrate transfer member 131A, and are transported to the main transfer member A3. Then, the wafers W are loaded into the development unit 128 by the main transfer member A3. In the development unit 128, the substrates are developed by a developer and then cleaned. Then, after the wafers W have been heated by the heating unit, the wafers W are returned to the original carrier C1 placed on the stage 120.

[Evaluation Tests]

(Wafer and Apparatus Used in Experiment)

A highly water-repellent resist was applied to a wafer. Then, the wafer was subjected to an immersion exposure process, and a development process by a development apparatus, so that there was formed a resist pattern whose line width of a recess was 150 nm. After the resist had been formed in all over the surface of the wafer, a contact angle with respect to water of a surface of the resist was 92 degrees. A cleaning apparatus incorporated in the development apparatus is the same as the first embodiment, excluding that the cleaning apparatus used in the experiment had a cleaning-liquid nozzle 4 and a gas nozzle 5 which could be independently controlled and moved. The contact angle slightly varies depending on measured positions of the wafer W. The contact angle herein means an average value of the contact angles measured at respective positions of the wafer W.

(Evaluation Test 1)

In the step 1 of the first embodiment, a flow rate at which a cleaning liquid was discharged to a central part of the wafer W was set at 250 ml/second, and a rotation number of the wafer was set at 500 rpm. In the step 2 (FIGS. 6B and 8), a distance d between an interface on a side of a to-be-discharged position of the gas in a to-be-discharged position of the cleaning liquid and an interface on a side of the to-be-discharged position of the cleaning liquid in the to-be-discharged position of the gas was set at 12.35 mm. Further, in the step 2, the rotation number f1 of the wafer when the cleaning-liquid nozzle 4 starts to be moved toward a periphery of the wafer W (see FIG. 9) was set at 3000 rpm, and the moving speed of the cleaning-liquid nozzle 4 was set at 6.5 mm/second. Other parameters were set at the values described in the first embodiment.

(Evaluation Test 2)

Figure 24:
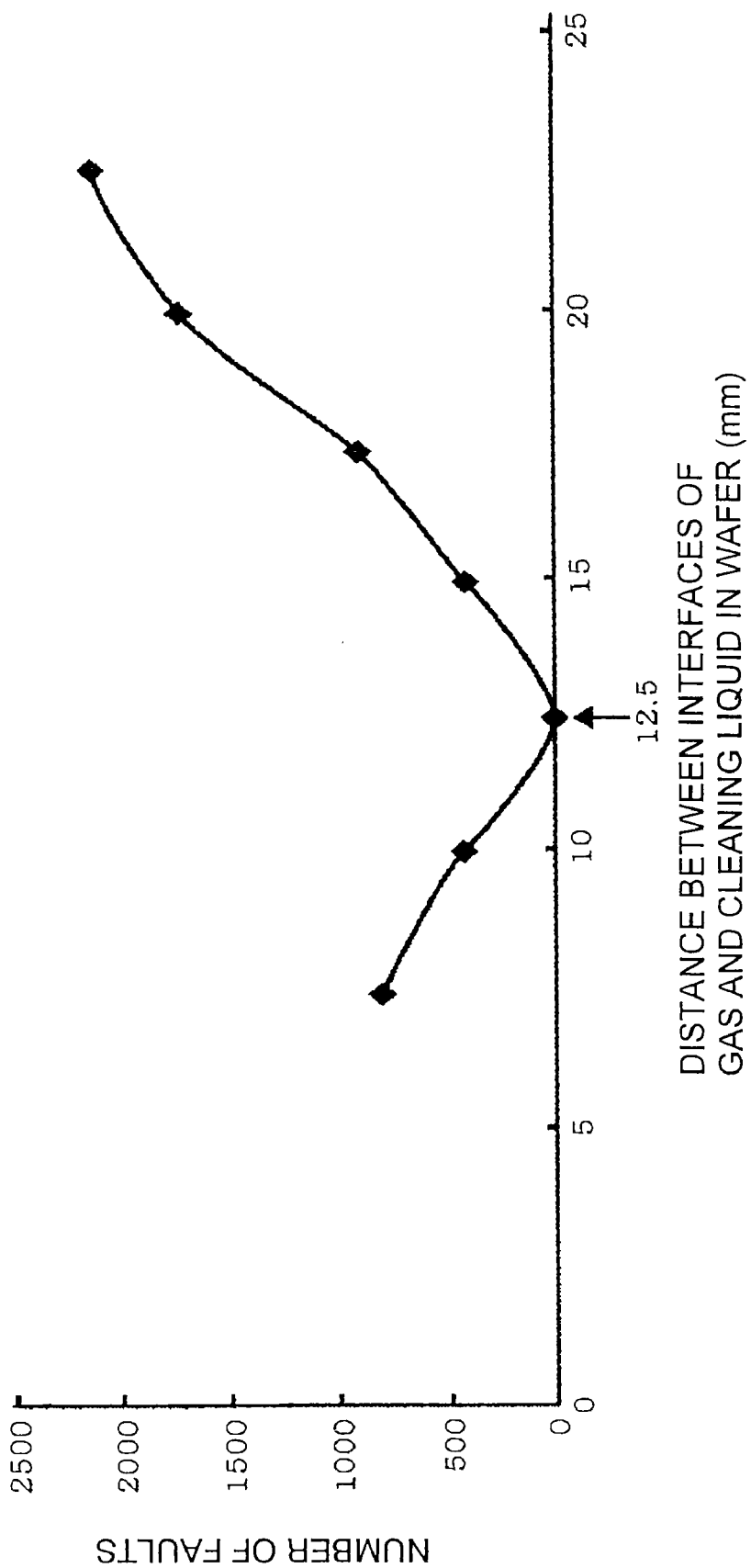
FIG. 24 is a graph showing a result of an evaluation test.
Figure 25:
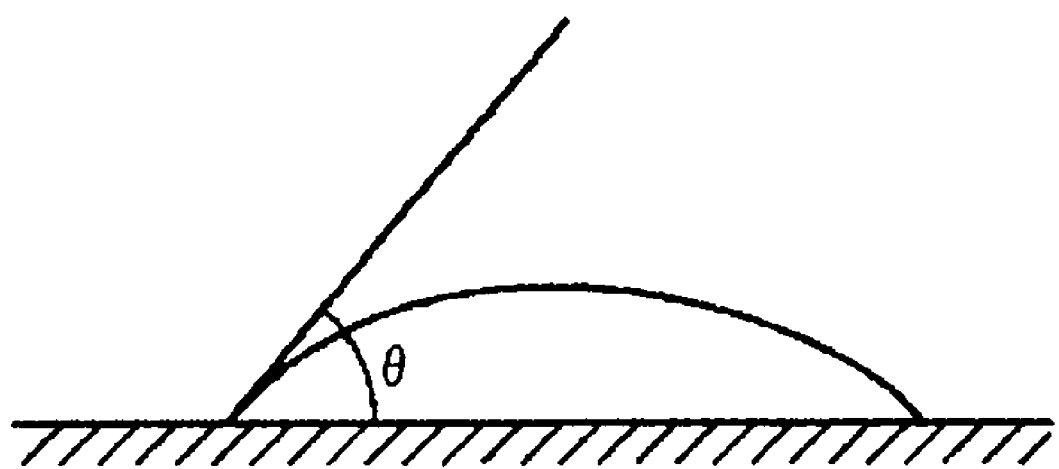
FIG. 25 is a view for explaining the "contact angle with respect to water" on a surface of a substrate.
Figure 26A:
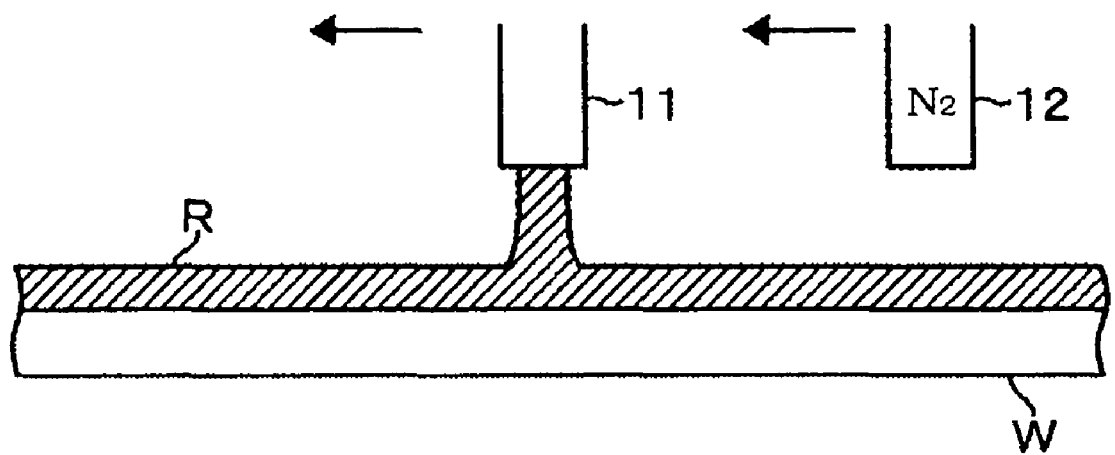
FIGS. 26A and 26B are explanatory views schematically showing states in which a wafer surface is cleaned by a conventional cleaning method.
Figure 26B:
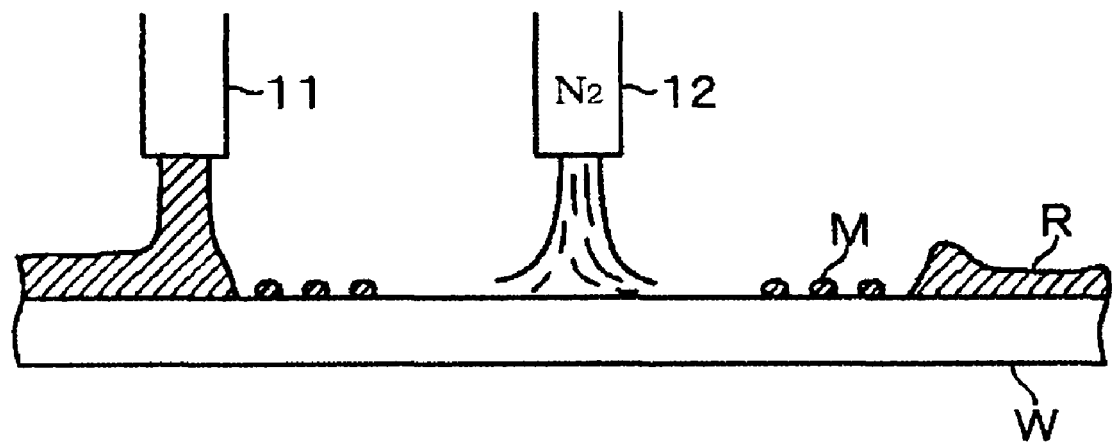

An experiment was conducted in which a distance d between the interface on the side of the to-be-discharged position of the gas in the to-be-discharged position of the cleaning liquid and the interface on the side of the to-be-discharged position of the cleaning liquid in the to-be-discharged position of the gas was varied for each wafer, but the other conditions were the same as those of the Evaluation Test 1. After the cleaning process, the numbers of faults (the number of particles) of the respective wafers W were measured. FIG. 24 shows the result. When the distances d between the interfaces were 7.35 mm, 9.85 mm, 12.35 mm, 14.85 mm, 17.35 mm, 19.85 mm, and 22.35 mm, the numbers of defaults were 810, 430, 25, 422, 891, 1728, and 2162, respectively. When the distance d was too small, there occurred problems in that the dried area 6 was not formed and/or the drying process took a longer time. On the other hand, when the distance d was too large, the large area was dried at once, and thus the number of faults was increased. Since the number of defaults is preferably 500 or less, it can be said that a range of the distance d effective in reducing the number of faults is between 9 mm and 15 mm, in consideration of the result of the experiment and some errors in fabrication and/or process of the apparatus.

(Evaluation Test 3)

A cleaning process was performed under the same conditions as those of the Evaluation Test 1, excluding that, after an $N_2$ gas had been discharged from the gas nozzle 5 so as to form the dried area 6, the cleaning-liquid nozzle 4 was moved at a constant speed of 10 mm/second toward the periphery of the wafer W. In this test, the number of faults was as large as 303. Namely, the number of faults was larger than that of the Evaluation Test 1 in which the moving speed of the cleaning-liquid nozzle 4 was 6.5 mm/second. Therefore, it could be confirmed that the moving speed of the nozzle has an influence on the number of faults.

The invention claimed is:

1. A substrate cleaning method for cleaning a surface of a substrate whose static contact angle with respect to water is 85 degrees or more, with the use of a first cleaning-liquid nozzle, a second cleaning-liquid nozzle, and a gas nozzle, which are integrally moved by a common drive mechanism via a nozzle holder, the substrate cleaning method comprising:
   a step in which the substrate is held horizontally by a substrate holder in such a manner that a central part of the substrate and a central part in rotation correspond to each other;
   a step in which, while the substrate holder is being rotated about a vertical axis, a cleaning liquid is discharged from the first cleaning-liquid nozzle to the central part of the substrate and is spread over all the surface of the substrate by a centrifugal force;
   a step in which, while the substrate holder is being continuously rotated, the nozzle holder is moved in such a manner that the cleaning liquid from the first cleaning-liquid nozzle is discharged to an eccentric position deviated from the central part of the substrate and that a gas is discharged from the gas nozzle to the central part of the substrate so as to form a dried area of the cleaning liquid under a condition in which a shortest distance between an edge of a cleaning liquid flow output from the cleaning-liquid nozzle and an edge of a gas flow output from the gas nozzle is set between 9 mm and 15 mm;
   a step in which, the nozzle holder is moved so as to move the first cleaning-liquid nozzle away from the central part of the substrate, and the cleaning liquid starts to be discharged from the second cleaning-liquid nozzle under a condition in which the gas is stopped to be discharged and a distance between the central part of the substrate and the to-be-discharged position of the cleaning liquid from the second cleaning-liquid nozzle is shorter than a distance between the central part of the substrate and a projection position of the gas nozzle onto the substrate; and
   a step in which, while the substrate holder is being continuously rotated, the to-be-discharged position of the cleaning liquid from the second cleaning-liquid nozzle is moved toward a periphery of the substrate at a speed lower than a speed at which the dried area is spread outward, with the cleaning liquid being discharged from the second cleaning-liquid nozzle.

2. The substrate cleaning process according to claim 1, wherein while the to-be-discharged position of the cleaning liquid from the second cleaning-liquid nozzle is moved toward the periphery of the substrate, the cleaning liquid from the first cleaning-liquid nozzle is stopped being discharged.

3. A substrate cleaning method for cleaning a surface of a substrate whose static contact angle with respect to water is 85 degrees or more, with the use of a cleaning-liquid nozzle and a gas nozzle, which are integrally moved by a common drive mechanism through a nozzle holder, the substrate cleaning method comprising:
   a step in which the substrate is held horizontally by a substrate holder in such a manner that a central part of the substrate and a central part in rotation correspond to each other;
   a step in which, while the substrate holder is being rotated about a vertical axis, a cleaning liquid is discharged from a cleaning-liquid nozzle to the central part of the substrate and is spread over all the surface of the substrate by a centrifugal force;
   a step in which, while the substrate holder is being continuously rotated, the nozzle holder is moved in such a manner that the cleaning liquid is discharged to an eccentric position deviated from the central part of the substrate and that a gas is discharged from the gas nozzle to the central part of the substrate so as to form a dried area of the cleaning liquid under a condition in which a shortest distance between an edge of a cleaning liquid flow output from the cleaning-liquid nozzle and an edge of a gas flow output from the gas nozzle is set between 9 mm and 15 mm;
   a step in which, the cleaning liquid and the gas are stopped being discharged, the nozzle holder is moved in a direction opposite to the direction in which the nozzle holder has been moved to form the dried area, and the cleaning liquid is restarted to be discharged at an outer edge position of the dried area; and
   a step in which, while the substrate holder is being continuously rotated, the to-be-discharged position of the cleaning liquid is moved toward a periphery of the substrate at a speed lower than a speed at which the dried area is spread outward, with the cleaning liquid being discharged.

4. The substrate cleaning method according to claim 3, wherein:
   the cleaning-liquid nozzle is configured to discharge the cleaning liquid in an inclined direction; and
   when the gas nozzle is moved from the central part of the substrate to the periphery thereof, a projection area of the cleaning-liquid nozzle onto the surface of the substrate in a discharge direction thereof is not positioned within the dried area.

5. The substrate cleaning method according to claim 3, wherein:
   the cleaning-liquid nozzle is disposed on the nozzle holder in such a manner that an orientation of the cleaning-liquid nozzle can be changed; and
   when the gas nozzle is moved from the central part of the substrate to the periphery thereof, the orientation of the cleaning-liquid nozzle is adjusted in such a manner that a projection area of the cleaning-liquid nozzle onto the surface of the substrate in a discharge direction thereof is not positioned within the dried area.

* * * * *